United States Patent
Nakayama et al.

[11] Patent Number: 6,157,072
[45] Date of Patent: *Dec. 5, 2000

[54] IMAGE SENSOR

[75] Inventors: Takehisa Nakayama, Hyogo; Tadashi Obayashi, Shiga; Yoichi Hosokawa, Hyogo; Kenji Kobayashi, Shiga; Satoru Murakami, Shiga; Tomoyoshi Zenki, Shiga, all of Japan

[73] Assignee: Kanegafuchi Chemical Industry Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/835,925

[22] Filed: Apr. 8, 1997

Related U.S. Application Data

[63] Continuation of application No. 08/688,066, Jul. 30, 1996, abandoned, which is a continuation of application No. 08/534,138, Sep. 26, 1995, abandoned, which is a continuation of application No. 08/348,507, Dec. 1, 1994, abandoned, which is a continuation of application No. 08/219,751, Mar. 29, 1994, abandoned, which is a continuation of application No. 07/872,277, Apr. 22, 1992, abandoned.

[30] Foreign Application Priority Data

| Apr. 27, 1991 | [JP] | Japan | 3-124754 |
| Jun. 30, 1991 | [JP] | Japan | 3-185691 |
| Jul. 17, 1991 | [JP] | Japan | 3-204054 |
| Mar. 5, 1992 | [JP] | Japan | 4-84575 |

[51] Int. Cl.$^7$ .................. H01L 31/00; H01L 31/075
[52] U.S. Cl. .................. 257/443; 257/448; 257/457; 257/458; 257/459
[58] Field of Search .................. 257/53, 54, 55, 257/433, 443, 448, 458, 457, 459; 250/208.1; 358/213.16, 213.15

[56] References Cited

U.S. PATENT DOCUMENTS

| 4,675,549 | 6/1987 | Steffe et al. | 358/213.16 |
| 4,700,231 | 10/1987 | Matsumoto | 358/213.16 |
| 4,827,117 | 5/1989 | Uchida et al. | 257/458 |
| 4,916,307 | 4/1990 | Nishibe et al. | 358/213.16 |
| 4,939,592 | 7/1990 | Saika et al. | 257/53 |
| 5,004,903 | 4/1991 | Kitamura et al. | 257/53 |
| 5,038,027 | 8/1991 | Ioka | 250/208.1 |
| 5,166,757 | 11/1992 | Kitamura et al. | 257/53 |
| 5,182,625 | 1/1993 | Miyake et al. | 257/443 |
| 5,187,596 | 2/1993 | Hwang | 250/208.1 |
| 5,191,202 | 3/1993 | Kitamura et al. | 250/208.1 |

FOREIGN PATENT DOCUMENTS

| 56-1318 | 1/1981 | Japan. | |
| 56-102168 | 8/1981 | Japan | 358/213.16 |
| 58-56363 | 4/1983 | Japan. | |
| 58-209270 | 12/1983 | Japan | 358/213.16 |
| 61-203668 | 9/1986 | Japan | 257/53 |
| 61-242068 | 10/1986 | Japan | 257/53 |
| 61-289661 | 12/1986 | Japan | 257/459 |
| 62-45061 | 2/1987 | Japan | 257/459 |
| 62-260360 | 11/1987 | Japan | 257/433 |
| 62-299068 | 12/1987 | Japan | 257/433 |

*Primary Examiner*—Ngân V. Ngô
*Attorney, Agent, or Firm*—Jordan & Hamburg LLP

[57] ABSTRACT

The invention relates to an image sensor for use in the facsimile device, image reader, digital scanner and the like. In this image sensor, the photodiodes and blocking diodes formed on an insulating board are insulated by a transparent interlayer insulating film and are connected in series and opposite polarity by coupling electrodes through contact holes in the transparent interlayer insulating film. This image sensor features a high reading speed and a low dark output noise.

19 Claims, 23 Drawing Sheets

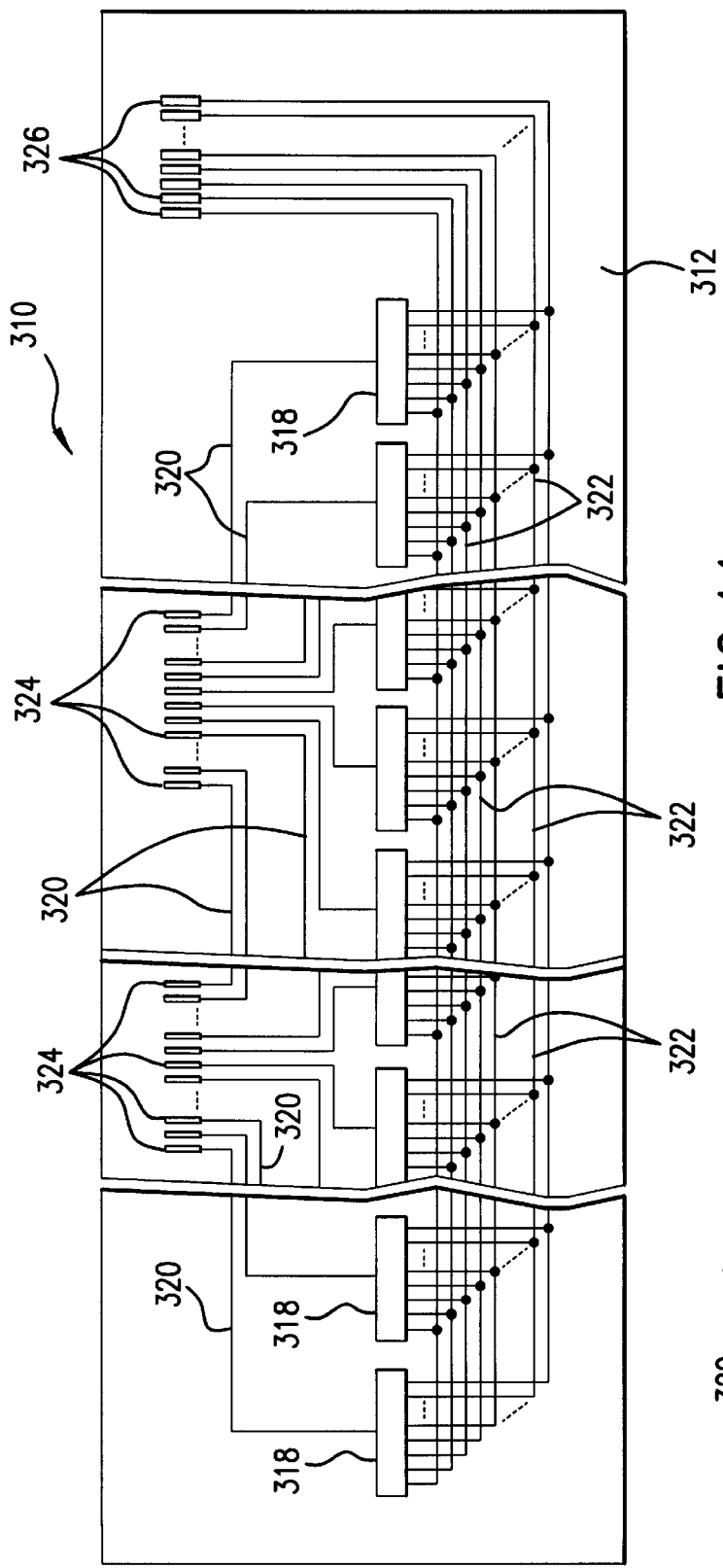
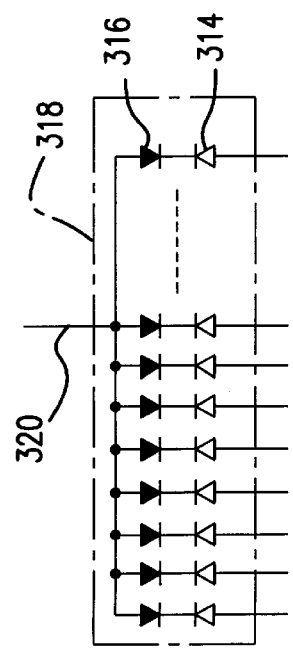
FIG.11a
FIG.11b

IMAGE SENSOR

This application is a continuation of application Ser. No. 08/688,066, filed Jul. 30, 1996, now abandoned, which is a continuation of application Ser. No. 08/534,138, filed Sep. 26, 1995, now abandoned, which is a continuation of application Ser. No. 08/348,507, filed Dec. 1, 1994, now abandoned, which is a continuation of application Ser. No. 08/219,751 filed Mar. 29, 1994, now abandoned, which is a continuation of application Ser. No. 07/872,277 filed Apr. 22, 1992, now abandoned.

BACKGROUND OF THE INVENTION

The present invention relates to an image sensor for use in facsimile devices, image readers, digital scanners and so on. More particularly, the invention relates to an image sensor comprising, as formed on one and the same substrate, a plurality of photoelectric energy converting elements, switching elements connected to said photoelectric converting elements, and a matrix wiring connected to said photoelectric converting element. In this specification the term "substrate" is sometimes replaced by "substrate board" or merely "board".

Prior Art No. 1 and its Problems

The image sensor heretofore used for a facsimile device, image reader, digital scanner or the like comprises a reducing optical system and a CCD (charge coupled device) type sensor. However, the recent development of thin-film semiconductor materials represented by hydrogenated amorphous silicon (hereinafter referred to briefly as a-Si:H) enabled the industry to form a plurality of photoelectric converting elements, switching elements, etc. on an elongated substrate board and thereby provide an extra-length image sensor capable of reading a document with isometric optics. As a result, amazing progresses have been made in the development of extra-length contact-type sensor devices utilizing such elongated image sensors.

With attention paid to the fact that, among various thin-film semiconductor materials, a-Si:H, in particular, can be used not only as a semiconductor material for photoelectric energy conversion but also as a semiconductor material for diodes, there was proposed an image sensor using diodes as switching elements and comprising a photoelectric converting element semiconductor layer and a diode semiconductor layer both formed from a-Si:H on the same substrate board, with a matrix wiring also formed on the same board (e.g. Japanese Kokai Patent Publication No. 56-1318 and No. 58-56363). Moreover, for accelerating the reading speed and realizing high-tone reading, there has been proposed a picture image sensor using PIN type photodiodes of a-Si:H as photoelectric energy converging elements and comprising diodes and matrix conductors on the same substrate board.

These prior art image sensors are comprised, as shown in FIG. 19, of a glass substrate board 1, a first electrode 2 of chromium Cr, blocking diodes 3 and photodiodes 4 which are connected in series and opposite polarity through said first electrode 2, and matrix conductors 5. Here, the photodiodes 4 and blocking diodes 3 are formed of the same amorphous silicon semiconductor layer and the photodiodes 4 and matrix conductors 5 are connected to each other by second electrodes 8 of chromium Cr through contact holes 7 formed in a transparent interlayer insulating film 6 of $SiO_2$, with the plurality of blocking diodes 3 being interconnected.

While this image sensor is so constructed that photodiodes 4 and blocking diodes 3 are connected in series and opposite polarity through the first electrodes 2 formed on the glass substrate board 1, the longitudinally extending matrix conductors 5 are, of necessity, formed simultaneously with said first electrodes 2 as seen from FIG. 19. However, the raw material for this first electrode 2 must be selected with attention to adhesion to the glass substrate board 1 and prevention of diffusion of metallic impurities into the amorphous silicon semiconductor layer. The preferred electrode materials from the standpoint of preventing diffusion of metallic impurities are metal materials such as chromium Cr, titanium Ti, nickel Ni and so on. On the other hand, from the standpoint of adhesion to the glass substrate board 1, the first electrode 2 and matrix wiring 5 are desirably as thin as possible ad this is also instrumental for reducing the steps formed in the transparent interlayer insulating film 6 and so on. However, in order to reduce the wiring resistance, the thickness of said first electrode 2 and matrix wiring is preferably thick enough. For this reason, if chromium Cr is used as a raw material for said first electrode 2 and matrix wiring 5, the resistance of the elongated matrix wiring 5 will be increased to increase the reading time constant in the reading of sensor electric signals, thus detracting from the high-speed reading performance of the image sensor.

The image sensor is so constructed that signals are serially read and processed in unit blocks arranged in a time-series. In the reading of such signals, the signal read by a photodiode in the (m)th block is affected by the corresponding photodiode in the immediately preceding (m−1)th block. This influence is significant in a device for reading multiple-tone colors. However, the photodiode in the (1)st block is not subject to the influence of other blocks, hence there is the problem that the signal output value from this block is different from the output values from the other blocks. Furthermore, the image sensor comprising photodiodes and blocking diodes formed by deposition of amorphous silicon semiconductor layers, for instance, tends to vary from one unit to another in the thickness of the built-up semiconductor layer so that these units are varying, though slightly, in characteristics.

An exemplary reading action in an image sensor is now described. First, an electric charge is accumulated in the photodiode, this accumulated charge is then released for a given time period according to the quantity of received light, and finally a driving pulse is applied to the photodiode for recharging to compensate for the amount of discharge. The integral value of current is read for use as a read signal. When the size of the blocking diode is sufficiently large with respect to the photodiode, the electric charge released from the photodiode is rapidly replenished so that the reading speed is high. However, the size of the blocking diode is determinant of the capacity of the blocking diode and there was the problem that when this capacity is large, the noise is produced by a capacitance kick in dark output so as to lower the signal-to-noise ratio.

Second prior art and its problem

The linear image sensor comprises a glass substrate board, a linear array of a plurality of semiconductor elements each consisting of a lower electrode, a semiconductor layer and an upper electrode, an inter-layer dielectric film covering and insulating said plurality of semiconductor elements, and a wiring disposed through said interlayer dielectric film. The size of semiconductor elements and conductors constituting this linear image sensor is of the order of $\mu m$ and the photolithographic technique is generally used for microfine processing. Since, in the manufacturing of a linear image sensor, the processes of film formation, photoresist coating, photomask positioning, exposure to light, and etching must be performed repeatedly, it is most advantageous to fabricate a large number of linear sensors in one production setup for reducing the cost of production.

To this end, it is common practice to form a plurality of linear image sensors on a glass substrate board having a large surface area and, then, cut the glass board with a dicer which is commonly used in the production of silicon wafers and the like to provide discrete linear image sensors. Here, a standard-sized glass substrate board having a thickness of 1.1 mm, which is easily available at low cost and easy to use, is generally employed. Then, as shown in FIG. 20, a resin film 103 is bonded to the reverse side of the glass substrate board 102, which carries semiconductor elements 101 and others on its face side, with an adhesive agent 104, and using the rotary cutter 105 of the dicer, the glass board 102 is serially cut to size, leaving the resin film 103. By the provision of this resin film, the boards 102 of individual linear image sensors 106 are prevented from entrapment by the rotary cutter 105 of the dicer or falling down to break.

For this cutting of the glass substrate board 102 with the dicer, there must be a cutting margin A, which is generally at least 0.2 mm, as shown in FIG. 21. When the width of the linear image sensor 106 in the subordinate scanning direction is 2 mm, for instance, the cutting margin A amounts to at least 10% of this dimension so that the number of unit linear image sensors 106 that can be obtained from one glass substrate board having a given area is as much limited. Moreover, since the glass is subject to chipping by the rotary cutter 105 at both sides B of the cutting line, there cannot be obtained sharp corner faces so that when the product linear image sensor 106 is built into a module, the positioning becomes difficult. Moreover, a margin to allow for this chipping B is required in the width of the glass substrate board 102 in the subordinate scanning direction, with the result that the number of linear image sensors 106 that can be obtained form a glass substrate of given dimensions is further limited.

Furthermore, the cutting of the glass substrate board 102 with the dicer is a time-consuming operation and is a rate-determining step of production. In addition, while the cutting length of the glass substrate board 102 depends on the reading size of the linear image sensor 106, it is generally about 200 to 340 mm and it requires a special long dicer to cut out such extra-length sensors. However, partly because such a long dicer has limited uses, it cannot be easily obtained and is expensive. Moreover, the dicer requires periodic change of its cutter 105 and, hence, entails a high running cost.

Moreover, while the resin film 103 is bonded to the reverse side of the blank glass substrate board 102 so that the cut board 102 will not be entrapped by the revolving cutter as mentioned before, this resin film 103 must be removed after completion of the cutting operation. This procedure involves dipping of the sensors in a solvent, for instance, but such treatment tends to damage the preformed semiconductor elements 101 and other components on the glass board 102.

Third prior art and its problems

This linear image sensor comprises a glass substrate board, a linear array of semiconductor elements each consisting of a lower electrode, a semiconductor layer and an upper electrode as formed on said substrate board, an interlayer dielectric film covering and insulating said plurality of semiconductor elements, and a wiring connected through said interlayer dielectric film. The film thicknesses of these semiconductor elements and conductors constituting this linear image sensor range from 800 to 1600 Angstrom units and their sizes are of the order of $\mu$m. For this reason, when, as shown in FIG. 22, a chromium film 202, which serves as a lower electrode, and an ITO film are formed on a glass substrate board 201 having an uneven surface due to curling or marring, a pinhole 203 tends to form around a convex or concave of irregularity. If a pinhole 203 is present, disconnection occurs at the pinhole 203 in patterning or the wiring resistance will be increased. Moreover, when the surface of the glass substrate board 201 is uneven or marred, the surface irregularity remains uncorrected even after super-imposition of a metal electrode film 202 as seen from FIG. 23, with the result that in the spin coating of photoresist 204 at the photofabrication stage, the photoresist 204 fails to adhere to the area 205 behind the recess or there occurs a difference in thickness of the photoresist film 204 between the convex and concave parts, thus leading to uneven exposure and poor patterning.

Furthermore, the linear image sensor for A4 size paper must have a length in excess of 200 mm in the main scanning direction and the electrode pads necessary for driving and reading are arranged along the entire length. At the testing of electrical characteristics, as shown in FIG. 24, the probing styluses 206 are contacted with the electrode pads arranged one-dimensionally. Therefore, when the glass substrate board 201 has a curl, an offset takes place between the probing stylus 206 and the electrode pad and, because of the varying height of the electrode pads, some styluses 206 may not contact the electrode pads, with the result that no proper test data can be generated. Moreover, there is the risk that in the spin coating of the photoresist, such a curled glass substrate board cannot be adsorbed by vacuum suction. In the exposure step, too, no uniform focusing can be accomplished. In addition, when a linear image sensor fabricated with such a curled glass substrate board 201 is bonded to a supporting board or a printed circuit board, the resulting linear stretching of the board 201 tends to damage the preformed semiconductor elements and conductors on the glass board. Moreover, fixing a curved glass substrate board for dicer cutting requires some special contrivance, while the scribe-break method has a drawback in that because the transmission of the bending force is irregular, the glass substrate cannot be broken at right angles with its surface.

Furthermore, when an amorphous silicon type semiconductor is used for the semiconductor layer forming a semiconductor element, chromium is generally used for the metal electrode layer so that metal atoms will not diffuse into this semiconductor layer. However, alkali tends to emigrate from the glass substrate beneath this metal electrode layer to form sodium chromate. Since this sodium chromate is water-soluble, there occurs the problem that pinholes are produced in the metal electrode layer.

SUMMARY OF THE INVENTION

To solve the above-mentioned problems, the inventors of the present invention conducted an intensive research and perfected the present invention.

The image sensor of the present invention, as a solution to the first problem mentioned above, generally comprises an insulating substrate board and, as formed one-dimensionally on said substrate board, a plurality of blocks each consisting of a plurality of photodiodes, the corresponding number of blocking diodes respectively connected in series and opposite polarity to said photoelectrodes, and a common electrode connected to said number of said blocking diodes in common, with a matrix wiring interconnecting the photodiodes in the same relative positions within respective said blocks, characterized in that said photodiodes and blocking diodes formed one-dimensionally on said insulating substrate board is covered with a transparent interlayer insulating film and each of said photodiodes is connected to the corresponding blocking diode in series and opposite polarity by a coupling electrode through a contact hole formed in said transparent interlayer insulating film (FIG. 1).

In one embodiment of the invention, the above image sensor further includes a read-out signal correcting block disposed at the initial end of the time series of said one-dimensional array of blocks, which read-out signal correcting block is structurally identical to said blocks forming the array and connected in light-receiving condition to said matrix wiring (FIG. 2).

In another embodiment of the invention, the above image sensor still further includes a dark output correcting block disposed either at the initial end or the terminal end of said time series of said one-dimensional array of blocks, which dark output correcting block is structurally identical to said blocks forming the array and connected to said matrix wiring in the condition shielding at least the corresponding photodiodes from light (FIG. 2).

The image sensor of the invention is further characterized in that the ratio of the area of the semiconductor part of said photodiode to the area of the semiconductor part of said blocking diode is 1:0.03 through 0.5 and preferably 1:0.05 through 0.25 (FIG. 1).

The above semiconductor part is preferably a PIN-type amorphous silicon semiconductor containing carbon C in its P-type semiconductor layer (FIG. 3).

The above image sensor is further characterized in that each of said photodiodes is connected to the corresponding blocking diode in series and opposite polarity on the N-type semiconductor layer side of the semiconductor having an N-type semiconductor layer (FIG. 3).

The above image sensor is further characterized in that a coupling electrode connecting the transparent electrode of said photodiode to the transparent electrode of said blocking diode covers at least the transparent electrode of the particular blocking diode (FIG. 1).

Preferably, the image sensor is further characterized in that at the connection of an electrode lead of said photodiode and said matrix wiring through a contact hole formed in said transparent interlayer insulting film, the line-width of the matrix wiring is broader than the line-width of the remainder of the matrix wiring (FIG. 1).

Preferably, the above image sensor is further characterized in that the region of the image sensor other than electrode conductors leading out from the electrodes of said blocking diodes and at least output electrodes of said matrix wiring for connection to an external device is covered with a protective film made of one or more materials selected from the group consisting of inorganic insulating materials such as silicon nitride and organic insulating materials such as epoxy resin (FIG. 1).

Preferably, the above image sensor is further characterized in that electrodes of said photodiodes and blocking diodes on said insulating board are made of a non-diffusing metal such as chromium and each of coupling electrodes connecting said photodiodes to said corresponding blocking diodes in series and opposite polarity is a multilayer structure consisting of at least 2 layers formed form a non-diffusing metal material such as chromium and a good electric conductor such as aluminum. The term "non-diffusing metal" used herein refers to a metal from which metal atoms will hardly diffuse.

In a preferred embodiment, the image sensor is further characterized in that the number of blocks constituting said image sensor is either 54 or 108 and the number of photodiodes and corresponding blocking diodes constituting each block is either 32 or 16 each.

In the image sensor of the invention, photodiodes and the corresponding blocking diodes as formed one-dimensionally on an insulating board are interconnected in series and opposite polarity by respective coupling electrodes through contact holes formed in a transparent interlayer insulating film covering said photodiodes and blocking diodes, with said coupling electrodes being formed on said transparent interlayer insulating film. Because of this construction, the material and film thickness for said coupling electrodes can be freely selected. Thus, as the raw material for these coupling electrodes formed over the transparent conductive layers of said photodiodes and blocking diodes, there can be selected a metal which will not diffuse into the semiconductor layers constituting these diodes, such as chromium, titanium, nickel and so on. Furthermore, the matrix wiring can be formed simultaneously with the formation of coupling electrodes on the transparent interlayer insulating film and these coupling electrodes and matrix wiring can be formed in an increased thickness. Particularly, the coupling electrodes and matrix conductors can be formed not only as single-layer structures but as multilayer structures. Thus, coupling electrodes and matrix wiring of low resistance values can be obtained by depositing two ore more good conductor metal films on the layer formed form said material which does not diffuse into semiconductors.

Moreover, the image sensor thus comprising a plurality of blocks each comprising a fixed number of photodiodes disposed one-dimensionally and the corresponding number of blocking diodes respectively connected in series and opposite polarity to said photodiodes is driven in a time series from one block to the next. In one mode of embodiment, the image sensor further includes a read-out signal correcting block, which is structurally identical to said blocks and connected in light-receiving condition to the matrix wiring, at the initial end of the time-series array of blocks. This correcting block reads the white area of the document and, based on a signal corresponding to the bright output condition causing a sufficient release of the accumulated charge, corrects the signals read by the intrinsic reading blocks. Furthermore, it is also a recommendable procedure to install a dark output correcting block either at the initial end or the terminal end of the time-series array of blocks, with or without provision of said read-out signal correcting block. The dark output correcting block shields the photodiodes in the particular block from light to establish the condition equivalent to reading a black document and corrects the signals read by the other blocks using the resulting dark output as a reference. By using the read-out signal correcting block or/and the dark output correcting block in this manner, the bright output or/and dark output signals are generated and using these signals, the read-out signals are corrected. In this manner, correct read-out signals can be obtained and, at the same time, the variation in characteristics between image sensors can be minimized.

Furthermore, by selecting the optimum surface area for the blocking diode, that is to say by setting the ratio of the area of the semiconductor part of the photodiode to the area of the semiconductor part of the blocking diode within the range of 1:0.03 through 0.5 and preferably 1:0.05 through 0.25, it is possible to insure rapid recharging of photodiodes and reduce the condenser capacity of blocking diodes to suppress the noise associated with capacitance kick in dark output, thus increasing the S/N ratio.

Since, in the image sensor of the present invention, the photodiodes and blocking diodes formed one-dimensionally on an insulting board are insulated by a transparent interlayer insulating film and these diodes are connected to each other in series and opposite polarity by respective coupling electrodes via contact holes formed in said transparent interlayer insulating film, there is no leak current between the two diodes and the coupling electrodes can be designed with low electric resistance. Particularly, a film of non-diffusing metal, such as chromium, from which metal atoms will hardly diffuse into the transparent electrode of the photodiode can be employed and, in addition, a good electric conductor such as aluminum may be further deposited in superimposition. In this manner, coupling electrodes having a low electric resistance and not causing degradation of semiconductors through diffusion of metal atoms can be provided. Moreover, in this arrangement, the matrix wiring can be formed on the transparent interlayer insulating film, so that the wiring with reduced wiring resistance can be obtained.

Furthermore, when the read-out signal correcting block and/or the dark output correcting block is provided, the read-out signals can be corrected by the bright output signal and/or the dark output signal obtained thereby so that accurate read-out signals can be outputted. Moreover, by this correction of read-out signals, the sensor-to-sensor variation in characteristics can be minimized.

The image sensor of the present invention, as a solution to the second problem, features the use of a glass substrate for said insulating board, which has a thickness of 0.3 to 1.1 mm, preferably 0.4 to 0.8 mm, and a width in the subordinate scanning direction of 1.0 to 4.0 mm (FIG. 4).

This image sensor glass substrate is preferably such that it has a length in the main scanning direction of 200 to 340 mm, a width in the subordinate scanning direction of 1.9 to 3.5 mm and a thickness of 0.5 to 0.75 mm (FIG. 4).

More preferably, the image sensor is characterized in that the ratio of the length in the main scanning direction to the width in the subordinate scanning direction of the glass substrate is not less than about 50 and the ratio of the width in the subordinate scanning direction to the thickness of the glass substrate is not less than about 0.9 and preferably not less than 1.8 (FIG. 4).

The thickness of the glass substrate for the image sensor of the invention is 0.3 to 1.1 mm and preferably 0.4 to 0.8 mm. The surface of this glass substrate is scribed with a diamond cutter, for instance, and with both sides of the scribing line held stationary, the glass is broken to provide individual image sensors. Thus, the inventors of the present invention discovered that when the thickness of the substrate glass is 0.3 to 1.1 mm and preferably 0.4 to 0.8 mm, even if the width in the subordinate scanning direction is 1.0 to 4.0 mm, the glass can be broken neatly without damaging the semiconductor elements, etc. formed on the substrate. While this scribe-break process consists of a scribing step and a breaking step, both steps are quite efficient and since the section of the broken glass is sharp, positioning is easy in assembling the sensor into a module. Furthermore, this scribe-break system does not require cutting allowances and because a diamond cutter or the like is employed, troubles such as broad chipping are never encountered. Thus, substantially no margin need be provided in the subordinate scanning direction. Therefore, the yield of image sensors per given surface area of glass can be increased. Furthermore, it is not necessary to bond a resin film or the like to the reverse side of the glass substrate and, hence, to remove the same afterwards, thus allowing the semiconductor elements etc. thereon to be kept safe and intact.

Moreover, when the glass substrate for the image sensor has a length in the main scanning direction of 200 to 340 mm, a width in the subordinate scanning direction of 1.9 to 3.5 mm and a thickness in the range of 0.5 to 0.75 mm or when the ratio of the length in the main scanning direction to the width in the subordinate scanning direction of the glass substrate is not less than about 50 and the ratio of the width in the subordinate scanning direction to the thickness of the glass substrate is not less than about 0.9 and preferably not less than about 1.8, the glass substrate can be scribed and broken neatly without damaging the semiconductor and other elements thereon even it it is long in the main scanning direction and narrow in the subordinate scanning direction. Moreover, since the width in the subordinate scanning direction can be decreased, the miniaturization of image sensors can be further facilitated.

Thus, because a glass substrate having a thickness of 0.3 to 1.1 mm and preferably 0.4 to 0.8 mm is used for the image sensor of the invention, even if the width in the subordinate scanning direction is as small as 1.0 to 4.0 mm, the substrate glass can be easily scribed with a diamond cutter or the like and broken neatly without damaging the semiconductor elements, conductors and other components formed thereon. Therefore, when the sensor is built into a module, the cut edge of the substrate glass can be utilized for positioning, thus facilitating the positioning procedure.

Moreover, because the substrate glass can be scribed and broken to size, no cutting margin or allowance is required, nor is there a risk of chipping, with the result that the yield of product sensors is increased and a sizable cost reduction is realized. Furthermore, the need of backing the glass with a resin film or the like and, hence, the trouble of peeling it off are eliminated and the associated damage to the semiconductor and other elements is prevented. Since all the required operations are scribing and subsequent breaking, a remarkable increase of productivity is insured. As the expensive dicer is not required, the running cost is decreased. Moreover, cooling water for cutting is not required, so that the semiconductor and other elements can be kept intact.

The image sensor of the invention, as a solution to the third problem, is characterized in that said insulating board is an alkali-free glass substrate having a surface roughness of not more than 500 Angstrom units on the side where said photodiodes etc. are formed and a curl in the main scanning direction of not more than 0.4 mm per 100 mm length (FIG. 7).

Preferably, this image sensor is further characterized in that the surface roughness of said glass substrate board is not more than 200 Angstrom units and the curl in the main scanning direction is not more than 0.2 mm per 100 mm length (FIG. 7).

More preferably, the glass substrate for the image sensor of the invention is an alkali-free glass sheet having a surface roughness of not more than 500 Angstrom units, preferably not more then 200 Å and a degree of curling in the main scanning direction of not more than 0.4 mm, preferably not more than 0.2 mm, per 100 mm length. The metal electrodes, transparent ITO electrodes, etc. which have been formed on a glass substrate satisfying the above conditions are virtually free from pinholes and these elements can be formed in substantially uniform thicknesses. Moreover, in the spin coating of a photoresist, there will be no such troubles as defecting of photoresist behind projections, uneven resist thickness, etc. and because sharp focusing is possible in the exposure step, accurate patterning is feasible. In the testing of electrical characteristics, the probe styluses can be exactly contacted to the electrode pads, thus expediting the test. Moreover, when the product image sensor is affixed to a supporting board or the like, no remarkable tensile or compressive stress is applied to the semiconductor elements or wiring, so that the risk of damaging the image sensor is eliminated. The use of alkali-free glass eliminates the problem of alkali diffusion.

Thus, because the glass substrate for the image sensor of the invention has a surface roughness of not more than 500 Å, preferably not more than 200 Å, there is no formation of pinholes when a thin film for the formation of lower electrodes or the like is applied to its surface. Therefore, there is no risk of breakage of the conductors, etc. formed by the thin film, nor is an increase of wiring resistance. The absence of pinholes means a reduced incidence of short circuit, too. Moreover, because of the absence of major surface irregularities and mars, the problem of local defection of photoresist or uneven photoresist thickness if obviated in forming photoresist by spin coating, thus reducing the incidence of poor patterning.

Furthermore, because the degree of curling of the glass substrate is not more than 0.4 mm and preferably not more than 0.2 mm per 100 mm length, uniform focusing is possible at the exposure step in the photofabrication process, thus eliminating the problem of poor patterning. Moreover, in the testing of electrical characteristics of the image sensor fabricated by using such a glass board, the probe styluses can be exactly contacted with the one-dimensionally disposed electrode pads. Furthermore, when the product image sensor is bonded to a supporting board or a printed circuit board, a curled substrate would be stretched and this might damage the semiconductor elements and wiring. With the image sensor of this invention, there occurs no such problem and a high degree of sensor reliability is insured. When the substrate is positioned by vacuum suction for the spin coating of a photoresist, the trouble of suction failure due to a curl in the glass is not encountered. Moreover, in the breaking of the substrate into product sensors, the bending force acts uniformly along the scribing line so that the work can be broken substantially at right angles with the glass surface.

Furthermore, since the glass is an alkali-free glass, it does not happen that the alkali is extracted out to form a water-soluble salt, e.g. sodium chromate, with the chromium ion in the lower electrodes and wiring electrodes formed on the substrate, thus avoiding the formation of pinholes and contributing further to the dependability of the image sensor.

In the document reader of a facsimile device or the like, there has been employed a contact-type image sensor adapted to read a document through an erect-image isometric lens system instead of the CCD type image sensor which reads the document through reducing optics.

As a typical example of the contact-type image sensor, a matrix-drive sensor is used as shown in FIGS. 25(*a*) and (*b*). This image sensor 400 comprises a glass substrate 402 and, as disposed one-dimensionally thereon, a plurality of blocks 408 each consisting of a plurality of photodiodes 404 and the corresponding number of blocking diodes 406, said blocking diodes 406 in each block being connected in common by a drive wiring 410 and said photodiodes 404 in the same relative positions within respective blocks 408 being connected in common by a read-out wiring 412. The ends of the drive wiring 410 of this image sensor 400 are provided with drive terminals 414 for connection to driving IC's (418), while the ends of said read-out wiring 412 are provided with read-out terminals 416 for connection to reading IC's (420).

As shown in FIG. 26, this image sensor 400 is affixed on a printed circuit board 422 carrying driving IC's 418 and reading IC's 420 for use as an image sensor module 424. In this image sensor 400, the drive terminals 414 are connected, by wire bonding, to the external drive wiring 426 formed on the printed circuit board 422, while this external drive wiring 426 is connected, by wire bonding, to the driving IC's 418. On the other hand, the read-out terminals 416 are directly connected to the reading IC's 420 by wire bonding.

Such an image sensor 400 requires wire bonding in a large number of positions and this entails a high cost. For example, when the total number of photodiodes is b 1728and these photodiodes are distributed in groups of 16 to 108 blocks 408, the number of drive terminals 414 is 108. Therefore, wire bonding must be performed at a minimum of 216 points. Moreover, because the external drive wiring 426 is routed about on the printed circuit board 422, the noise on this printed circuit board 422 may cause a variation in sensor output. Thus, there is the problem that the image sensor is susceptible to the influence of noise.

In contrast, there is an image sensor 434 in which, as shown in FIG. 27, the drive terminals 432 of drive wiring 428 on the glass substrate 430 are disposed only on one side of the glass substrate 430. In this case, the drive terminals 432 can be directly bonded to the driving IC 420 by wire bonding so that the required number of wire bonding is decreased. However, when the number of blocks 408 is 108, the number of drive conductors 428 is as many as 108 and, therefore, the width along the minor side of the image sensor 434 becomes very broad. For this reason, the number of product image sensors that can be obtained from one substrate sheet is small, thus being disadvantageous costwise. Since these image sensors 400 and 434 have their own advantages and disadvantages, they are selectively used in consideration of quality and cost.

Generally, image sensors are available in an assortment of sizes, A4, B4, A3 and so on, and the number of blocks varies accordingly. Therefore, a special driving IO must be fabricated for each size. This not only means a very high production cost but entails great inconveniences in the design, manufacturing and maintenance of image sensors.

To solve the above problems and provide an image sensor which features a high S/N ratio despite narrow width, requires a reduced number of wire bondings in assembling into a module and permits the use of inexpensive driving IC's, the inventors of the present invention conducted an intensive research and ultimately completed the invention.

The image sensor of this invention comprises an insulating substrate board and, as formed one-dimensionally thereon, a plurality of blocks each consisting of a plurality of pairs of a blocking diode and a photodiode, the blocking diodes in each block being connected by a common drive wiring and the photodiodes in the same relative positions in respective blocks being interconnected by a read-out wiring, characterized in that drive terminals at ends of said drive wiring are grouped in predetermined numbers and disposed collectively in a plurality of positions on said substrate board (FIG. 11).

Preferably, this image sensor is further characterized in that the drive terminals at ends of said drive wiring and read-out terminals at ends of said read-out wiring are disposed at one side on said substrate board (FIG. 11).

Preferably, this image sensor is further characterized in that a dummy wiring is disposed in proximity with at least either one of said drive and read-out wirings (FIG. 15).

Preferably, this image sensor is further characterized in that said read-out wiring is connected to lead conductors from said photodiodes via a plurality of contact holes and the line-width of said read-out wiring at the connections is made broader than the line-width of the remainder of said read-out wiring (FIG. 13).

Preferably, this image sensor is further characterized in that said image sensor is a contact-type image sensor which reads a document through an erect-image isometric lens system.

In this image sensor, the drive terminals are divided in groups of a predetermined number and disposed collectively in a plurality of positions on the substrate board. Since, in this arrangement, the driving IO can be directed connected to these drive terminals by wire bonding, the number of wire bonding jobs is decreased. Moreover, since each of these driving IO's is connected to a fixed number of drive terminals, the universal type driving IO's can be utilized. Furthermore, even if the total number of drive conductors is large, the drive terminals disposed in discrete groups do not call for any remarkable increase in the sensor width. Moreover, since the drive wiring is formed on the glass substrate, the influence of noise is minimal.

On the other hand, since the drive terminals and the read-out terminals are disposed only at one side of the board, the width of the image sensor is further decreased. Moreover, the dummy wiring contributes to reduced noise and particularly the dummy wiring disposed near the drive wiring contributes to a drastic reduction of the noise due to fluctuating floating capacity between the drive conductors. In addition, since the read-out conductors and lead conductors are connected through a plurality of contact holes and the line-width of the read-out conductors is broadened at connections, there is obtained a low and stable contact resistance, the variation in bright and dark outputs is minimized and the S/N ratio is increased.

Since, in the large sensor of this invention, the drive terminals are divided into groups and collectively disposed in several positions on the substrate board, the drive terminals can be directly connected to the driving IO by wire bonding so that the number of wire bonding jobs is decreased. As a consequence, the manufacturing cost is drastically reduced. Moreover, it is not necessary to fabricate an exclusive driving IO according to the size of the image sensor but the universal type, inexpensive and small driving IO can be utilized. While this requires the use of a plurality of driving IO's the cost involved is rather lower than the cost of using one exclusive driving IO. Thus, the design, manufacturing and maintenance of image sensors are remarkably simplified.

Furthermore, since the drive terminals are disposed in several groups, the width of the image sensor is not increased so much. Therefore, a large number of image sensors can be obtained from a single large-size substrate sheet and this is a definite cost advantage. Moreover, since the drive wiring is formed on the glass substrate, it is hardly susceptible to the influence of noise.

In addition, as the drive terminals and read-out terminals are disposed at one side on the board, the width of the image sensor is further decreased. Moreover, since the dummy wiring is available near the drive wiring, etc., the noise is reduced and the S/N ratio of the image sensor is improved. Since the read-out conductors and leads are connected through a plurality of contact holes and the line-width of the read-out conductors is broadened at connections, the contact resistance is low and stable. Thus, an image sensor with stable output can be implemented.

BRIEF DESCRIPTION OF THE DRAWINGS

FIG. 11 is a view showing a still another image sensor according to the invention, wherein (a) is a partially exploded view showing the arrangement of components and (b) is a block wiring diagram;

DETAILED DESCRIPTION OF PREFERRED EMBODIMENTS

Image sensors as preferred embodiments of the present invention are now described with reference to the accompanying drawings.

Figure 1A:
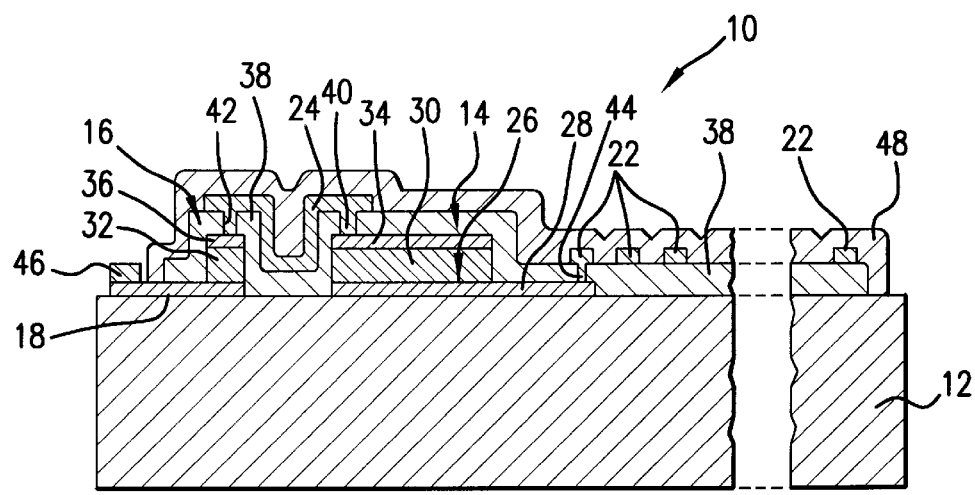
FIG. 1 is an elementary view of an image sensor according to the invention, wherein (a) is a front sectional view showing main components and (b) is a plan view showing the main components.

Referring to FIG. 1(a) and (b), the reference numeral 10 indicates an image sensor of the invention. This image sensor 10 generally comprises an insulating board 12, which is made, for example, of glass, and, as disposed one-dimensionally thereon, a plurality of photodiodes 14 as photoelectric energy converting elements and a plurality of blocking diodes 16 as switching elements for prevention of the cross-talk between said photodiodes 14. A predetermined number of said blocking diodes 16 are connected to one common electrode 18 and this common electrode 18, said predetermined number of blocking diodes 16, and a predetermined number of photodiodes 14 corresponding to said blocking diodes 16 constitute one block 20. Also formed on said insulating substrate board 12 is a matrix wiring 22 by which the photodiodes 14 in the same relative positions in a plurality of blocks 20 are interconnected. Moreover, each photodiode 14 is connected to the corresponding blocking diode 16 in series and opposite polarity by a coupling electrode 24. These components as a whole constitute an image sensor 10.

The image sensor 10 can be manufactured by the following method. First, a metal film is formed and patterned on an insulating substrate board 12 to form common electrodes 18 each adapted to connect a predetermined number of blocking diodes 16, first electrodes 26 for respective photodiodes 14, and electrode lead conductors 28 connecting said first electrode 26 to a matrix wiring 22. The metal film material for the formation of said common electrodes 18 and said first electrodes 26 having electrode lead conductors 28 is a non-diffusing metallic material from which metal atoms are hardly diffusable into the amorphous silicon and other semiconductors and is preferably a chromium or other material which shows good adhesion to the glass or other insulating substrate board 12. The patterning of these electrodes 18 and 26 is carried out by photolithography after formation of the metal film.

Then, amorphous silicon or other semiconductor films 30 and 32 for use as photodiodes 14 and blocking diodes 16 are deposited on the first electrodes 26 and common electrodes 18, respectively. Among amorphous silicon semiconductors, one having N-type semiconductor layer, particularly of a PIN structure, is preferred for these semiconductor films 30 and 32. Among amorphous silicon semiconductors of PIN structure, one containing carbon C in its P-type semiconductor layer is particularly preferred. Superimposed on the semiconductor members 30 and 32 thus deposited are transparent electrodes 34 and 36, respectively, which are made of ITO or the like. The semiconductor members 30, 32 and transparent electrodes 34, 36 may be formed in a pattern by the masking method or by photolithography after successive deposition of said semiconductor layer and transparent electrode layer.

The ratio of the area of photodiode 14 consisting of the first electrode 26, semiconductor film 30 and transparent electrode 34 to the area of blocking diode 16 consisting of the common electrode 18, semiconductor film 32 and transparent electrode 36 are within the range of 1:0.03 through 0.25. The optimum area ratio is experimentally determined so that the reading speed will be fast enough and the S/N ratio will be maximal. The larger is the area of the blocking diode 16, the larger is the current value in the forward direction and the faster is the speed of charging the photodiode 14. Moreover, by reducing the capacity of the blocking diode 16, the noise due to capacitance kick in dark output can be suppressed to increase the S/N ratio.

Then, those photodiodes 14 and blocking diodes 16 are covered with a transparent interlayer insulating film 38, whereby not only the photodiodes 14 and blocking diodes 16 but the electrode leads 28 extending from the first electrodes 26 of photodiodes 14 are insulated. SiOx, for instance, is used for the formation of said transparent interlayer insulating film 38. In predetermined positions of this transparent interlayer insulating film 38, contact holes 40, 42 and 44 are provided by, say, photolithography.

Then, the coupling electrodes 24 connecting the photodiodes 14 to the corresponding blocking diodes 16 and the matrix wiring 22 extending along the length of the insulating substrate board 12 are simultaneously patterned, for example by the masking method. Each of the coupling electrodes 24 is connected to the transparent electrode 34 of the corresponding photodiode 14 through the contact hole 40, while it is connected to the transparent electrode 36 of the corresponding blocking diode 16 through the contact hole 42. By this coupling electrode 24, the photodiode 14 and blocking diode 16 are interconnected in series and opposite polarity. Here, the coupling electrode 24 is formed in such a manner that it covers at least the transparent electrode 36 of the blocking diode 16, thus shielding the blocking diode 16 from light so that it will not act as a photoelectric energy converting element.

Figure 1B:
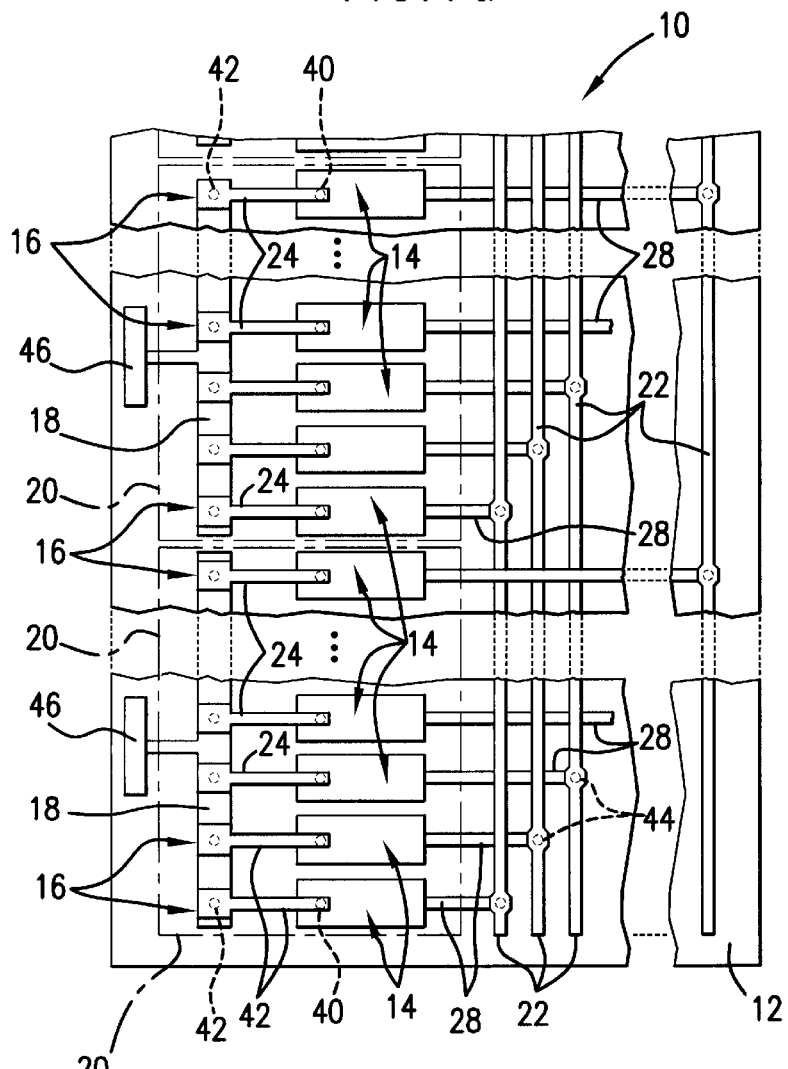

On the other hand, the matrix wiring 22 formed on the transparent interlayer insulating film 38 is electrically connected through the contact hole 44 in the leading end of the electrode conductor 28 extending from the first electrode 26 of each photodiode 14. In this connection between the matrix wiring 22 and the electrode conductor 28 through the contact hole 44, the line-width of the matrix wiring 22 at the contact hole 44 is greater than that of the remainder for reducing the connecting resistance and preventing misconnection as illustrated in FIG. 1.

Moreover, output electrodes 46 formed integrally with common electrodes 18 for connection to an external device are also preferably coated with the metal used for the formation of the coupling electrodes 24 and matrix wiring 22 at the same time. The metal material for use in the formation of said connecting electrodes 24 and matrix wiring 22 should be such that, when deposited on the transparent electrodes 34,36 of photodiodes 14 and blocking diodes 16 through the contact holes 40,42, its metal atoms will not diffuse into the transparent electrodes 34,36 and semiconductor layers 30,32. Thus, for example chromium, titanium and nickel may be mentioned. While the coupling electrodes 24 and matrix wiring 22 can be formed exclusively of such a non-diffusing metal material, there may be employed a two-layer or multiple layer structure such that the coupling electrodes 24 and matrix wiring 22 made of said non-diffusing metal are further covered with a good conductor material such as aluminum. The matrix wiring 22 can be formed exclusively of such a good conductor. Thus, since the coupling electrodes 24 and matrix wiring 22 are disposed on top of the other components constituting the image sensor 10, they may be formed with sufficient thickness so as to reduce the wiring resistance.

The photodiodes 14, blocking diodes 16 and matrix wirings 22 formed on the insulating board 12 are further covered with a protective film 48 except in the area corresponding to output electrodes 46 of the common electrodes 18 and output electrodes of the matrix wirings 22. The material for this protective film may be an inorganic insulating material such as silicon nitride, an organic insulating material such as epoxy resin, phenolic resin or the like, or a composite of inorganic and organic insulating materials.

Figure 2A:
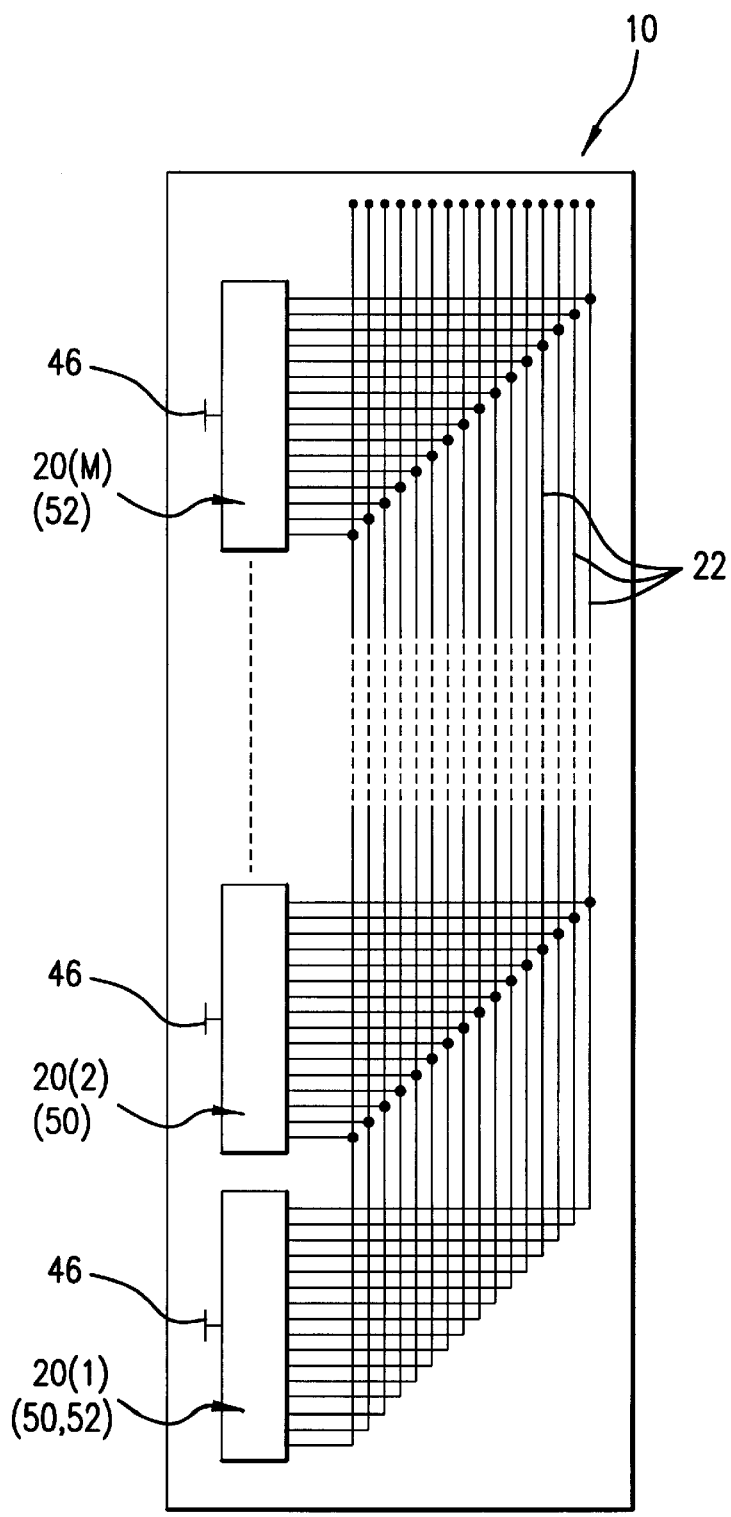
FIG. 2 is an explanatory view showing an image sensor of the invention, wherein (a) is a plan view and (b) is an elementary view showing the electrical system within a single block.
Figure 2B:
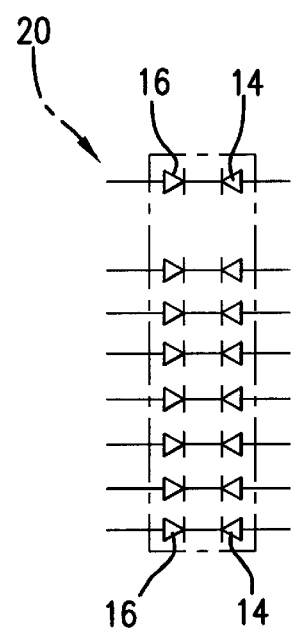
Figure 3:
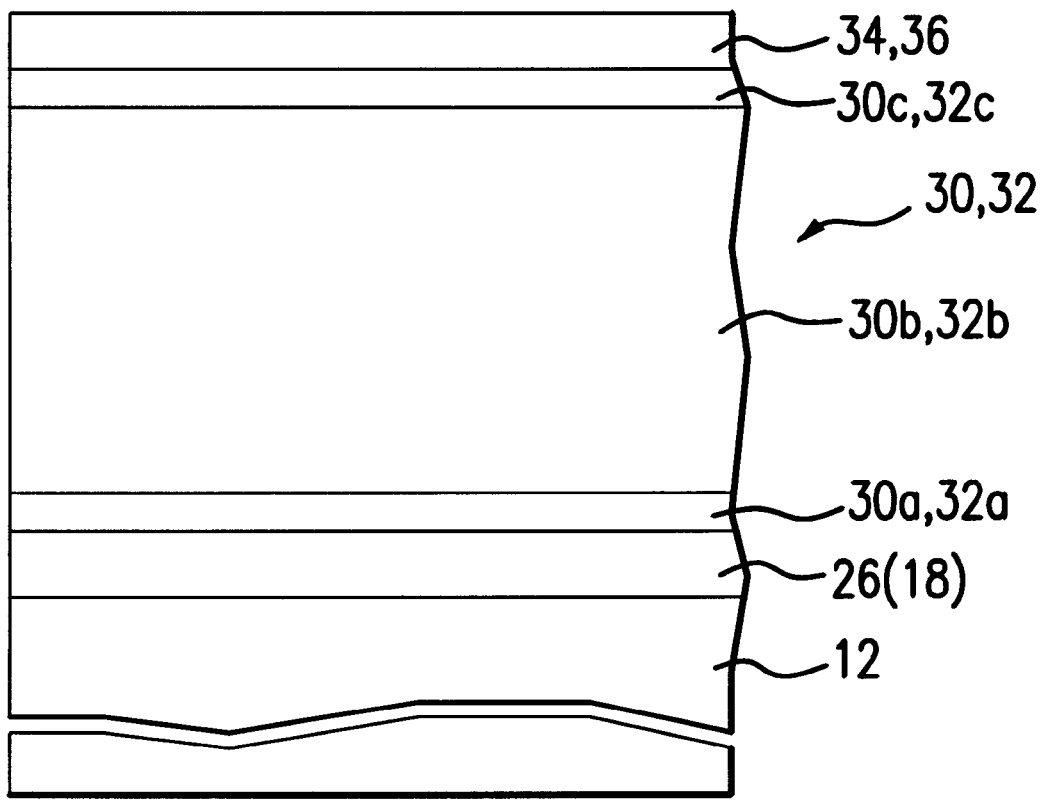
FIG. 3 is an elementary view showing the main components of an image sensor of the invention on exaggerated scale.

The image sensor 10 of the above construction comprises, as shown in the overall view of FIG. 2, a one-dimensional array of blocks 20 each consisting of a plurality of photodiodes 14 arranged one-dimensionally and a corresponding plurality of blocking diodes 16 connecting thereto in series and opposite polarity. When this image sensor 10 is built into a facsimile device and a driving signal is transmitted from a driver circuit, not shown, in a time series to the output electrodes 46 of respective blocks 20, these blocks are driven one after another in that time series. From the driven block 20, a read-out signal corresponding to each photodiode 14 is transmitted through the matrix wiring 22 to a processing circuit, not shown, for signal processing. Since the image sensor 10 of the invention is designed to provide a high reading speed with a reduced wiring resistance, there can be implanted a high-speed image sensing device.

While, as mentioned above, the reading operation in this image sensor 10 proceeds in a time series from one block 20 to the next block 20, the photodiodes 14 in the (m)th block 20 are subject to the influence of the photodiodes 14 in the (m-1)th block 20. Referring to FIG. 2, wherein the blocks are designated as 20(1), 20(2) . . . 20(M) in accordance with the time series, a signal correcting block(50), which is structurally similar to the reading blocks 20 and connected to the matrix wiring 22 in light-receiving condition, is preferably disposed at the initial end of the time series, viz. block 20(1). Thus, assuming that, in the above view, blocks 20(2), 20(3) . . . 20(M) are intrinsic reading blocks, the block 20(1) is used as the read-out signal connecting block 50. This read-out signal correcting block 50 performs blank reading, i.e. reads the white area of the document, for correcting the signals read by the intrinsic reading blocks 20(2), 20(3) . . . 20(M) based on a signal in the bright output condition insuring sufficient release of the accumulated electric charge.

Together with this read-out signal correcting block 50 or without provision of this read-out signal correcting block 50, a block (52) for dark output correction may be provided. This dark output correcting block (52) shields at least the photodiodes 14 within the particular block 52 from light to put them into the same condition as reading a block document and, based on the dark output signal thus obtained, corrects the signals read by the other blocks, viz. reading blocks 20. This dark output correcting block 52 is disposed at the initial or terminal end of the time-series array of blocks 20. In FIG. 2, for instance, the block 20(1) at the initial end of the block 20(M) at the terminal end of the time series is used as the dark output correcting block 52. When this block 52 is used in combination with said read-out signal correcting block 50, it is possible to either use the initial block 20(1) as the read-out signal correcting block 50 and the terminal block 20(M) as the dark output correcting block 52 or use the initial block 20(1) as the dark output correcting block 52 and the next block 20(2) as the read-out signal correcting block 50. By using the read-out signal correcting block or/and the dark output correcting block 52 in this manner, the bright output or/and dark output signals are generated and using these signals, the read-out signals are corrected. In this manner, correct read-out signals can be obtained and, at the same time, the variation in characteristics between image sensors can be minimized.

While one embodiment of the image sensor of the invention has by now been described in detail, it preferably has 54 blocks each comprising 32 each of photodiodes and blocking diodes or 108 blocks each comprising 16 each of photodiodes and blocking diodes, although these numbers are not exclusive choices. Moreover, while various combinations of component elements are shown for the above embodiment, these are not exclusive choices, either. Thus, the essential and primary feature of the invention resides in the construction that photodiodes and blocking diodes formed on a common insulating substrate board are interconnected in series and opposite polarity through respective coupling electrodes via contact holes and the invention is preferably reduced to practice by using various components in the optimum combination according to the intended use.

Now, using a 7059 glass board (manufactured by Corning Glass) as the insulating substrate board 12, a chromium film (26) having a thickness of about 500–2000 Å was first deposited by the sputtering method on the board 12 and, then, patterned to provide common electrodes 18 and electrodes 26 equipped with electrode leads 28, as shown in FIG. 1.

Then, an amorphous silicon semiconductor film (30,32) of PIN structure was superimposed. This semiconductor film consisted, in the order of deposition, of a p-type semiconductor layer (30a,32a) composed of hydrogenated amorphous silicon carbide (a-SiC:H; about 300 Å thick), an I-type semiconductor layer (30b,32b) composed of hydrogenated amorphous silicon (a-Si:H, about 6000 Å thick) and an N-type semiconductor layer (30c,32c) composed of hydrogenated amorphous silicon (a-Si:H, about 300 Å thick). To reduce the dark output, the P-type semiconductor layer was made of a-SiC:H and the heterojunction structure was employed. Superimposed on the N-type semiconductor layer was an ITO transparent electrode layer 34,36, which was about 800 Å thick.

Then, this semiconductor layer was processed by photolithography and RIE to provide photodiodes 14 and blocking diodes 16 as discrete elements. In other words, the photodiodes 14 and blocking diodes 16 were made of the same PIN semiconductor. The size of photodiodes 14 was 105×34 $\mu$m and that of blocking diodes 16 was 34×34 $\mu$m. The size of the photodiodes was approximately equal to, or slightly larger than that of first electrodes 26. Thus, the area of the semiconductor part 30 of the photodiode 14 and that of the semiconductor part 32 of the blocking diode 16 were in the ratio of 1:0.1.

Then, at both ends of the array of 54 blocks, a read-out signal correcting block and a dark output correcting block were formed to provide a total of 56 blocks. The number of photodiodes 14 and blocking diodes 16 per block was 32 each. The density of photodiodes 14 and blocking diodes 16 was 8 pieces/mm.

Then, as a transparent interlayer insulating SiOx film was deposited in a thickness of about 1 to 1.5 μm and this transparent interlayer insulating film 38 was then formed with contact holes 40, 42 and 44, by photolithography or RIE, in predetermined positions over the photodiodes 14, blocking diodes 16 and first electrodes 26. Then, a chromium film, about 1000 Å thick, and an aluminum film, about 1.5 μm thick, were deposited thereon and patterned to provide coupling electrodes 24 connecting said photodiodes 14 to blocking diodes 16 through said contact holes 40,42, 44. The matrix wiring 22 was also formed simultaneously. At the output electrodes 46, too, the chromium film and aluminum film were formed at the same time. The line-width of the matrix wiring 22 at connections of the electrode leads 28 to the matrix wiring 22 was made broader than that of the remainder of the wiring. Then, as a protective film 48, SiNx was deposited by CVD in a thickness of about 1 μm. For improved reliability, a transparent printing paste based on epoxy resin was further coated.

When this image sensor was tested at an illuminance of 50 lux, the rise and fall of the signal waveform were more steep as compared with the conventional image sensor. The necessary minimum reading time of this image sensor was 16 μseconds as compared with 32 μseconds of the conventional image sensor. The S/N ratio was also higher, i.e. $\geq$24 dB for the image sensor of the invention Vs. 18 dB for the conventional image sensor.

An example of the glass substrate of the image sensor of the invention is now described in detail with reference to the drawings.

Figure 5A:
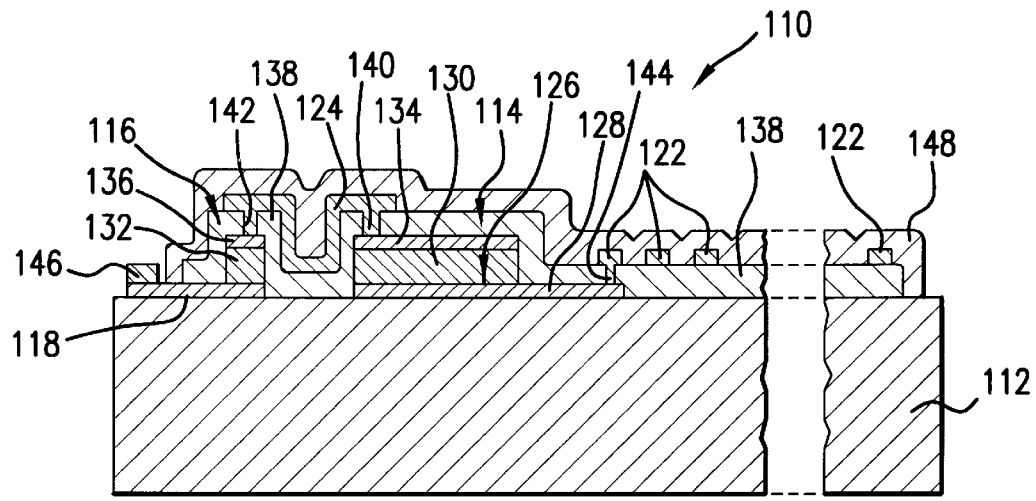
FIG. 5 is a view showing an example of the semiconductor device to which the invention is applicable, wherein (a) is a sectional elementary view of the main components and (b) is a plan view for explaining the main components.

Referring to FIG. 5(a) and (b), the reference numeral 110 indicates a linear image sensor of the invention. This linear image sensor 110 generally comprises a glass substrate board 112 and, as disposed one-dimensionally thereon, a plurality of photodiodes 114 as photoelectric energy converting elements and a plurality of blocking diodes 116 as switching elements for prevention of the cross-talk between said photodiodes 114. A predetermined number of said blocking diodes 116 are connected by one common electrode 118 and this common electrode 118, said predetermined number of blocking diodes 116, and a predetermined number of photodiodes 114 corresponding to said blocking diodes 116 constitute one block 120. Also formed on said glass substrate board 112 is a matrix wiring 122 by which the photodiodes 114 in the same relative positions in a plurality of blocks 120 are interconnected. Moreover, each photodiode 114 is connected to the corresponding blocking diode 116 in series and opposite polarity by a coupling electrode 124. These components, taken together, constitute an image sensor 110.

Figure 4A:
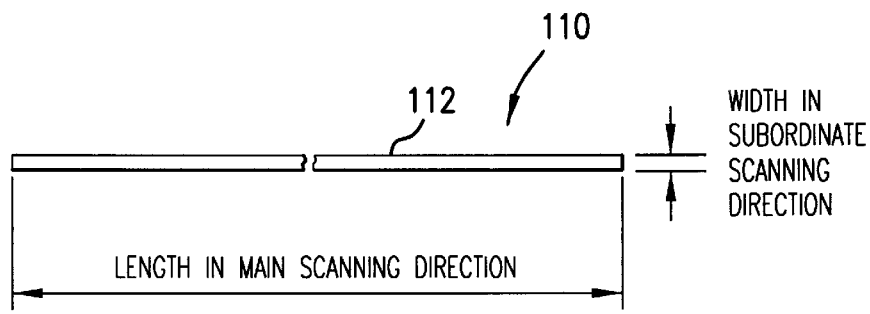
FIG. 4 is an explanatory view showing the glass substrate board of an image sensor according to the invention; wherein (a) is a plan view of the glass substrate board and (b) is a plan view showing a large-area glass substrate for use in the manufacture of image sensors.
Figure 4B:
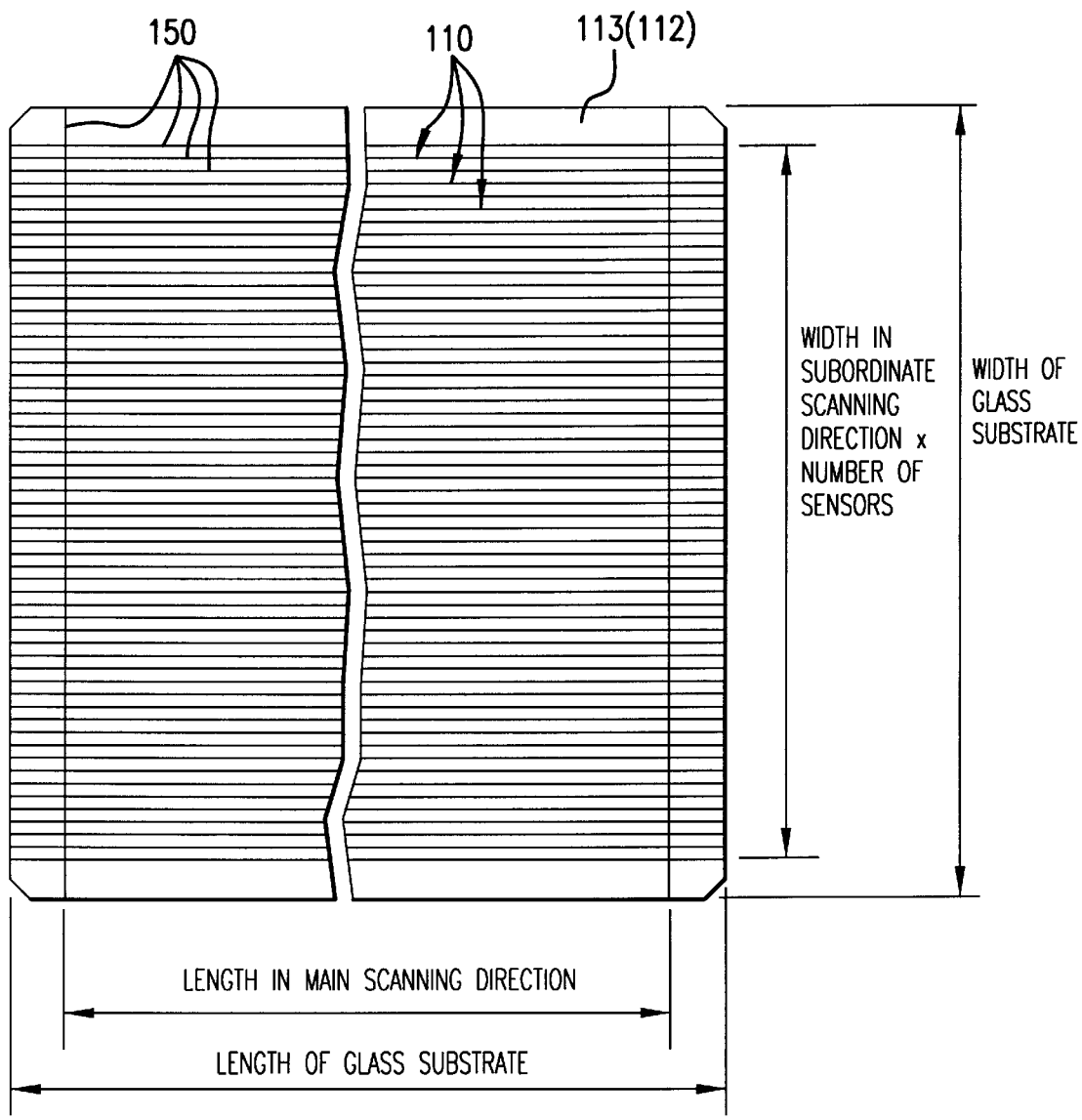

For the manufacture of the above image sensor 110, a glass substrate 113 of large surface area is first selected as shown in FIG. 4(b). The thickness of this large-area glass substrate is 0.3 to 1.1 mm, preferably 0.4 to 0.8 mm and, for still better results, 0.5 to 0.75 mm. The length of the glass substrate 113 is greater than the length of the linear image sensor 110 in the main scanning direction (e.g. 200 to 340 mm) and its width is greater than the width of the linear image sensor 110 in the subordinate scanning direction (1.0–4.0 mm, e.g., 2.0 mm) multiplied by the number of sensors 110 to be manufactured. Thus, the length of the glass substrate 113 depends on the type of linear image sensor to be manufactured, e.g. one for A4 size, B4 size or A3 size, and is selected according to the desired size of the image sensor. The width of glass substrate 113 is usually fixed relative to length. Therefore, the width of glass substrate 112 for the linear image sensor 110 is set in consideration of the maximum width of component elements, e.g. semiconductor elements, conductors, etc., in the subordinate scanning direction and, based on the width so set, the number of linear image sensors 110 is determined.

Then, as shown in FIG. 5(a) and (b), a metal film is formed on the large-area glass substrate 113 (112) and patterned by photolithography to form common electrodes 118 each adapted to connect a predetermined number of blocking diodes 116, lower electrodes 126 for respective photodiodes 114, and electrode lead conductors 128 connecting said lower electrodes 126 to a matrix wiring 122. The metal film material for the formation of said common electrodes 118 and said lower electrodes 126 having electrode lead conductors 128 is a non-diffusing metallic material from which metal atoms are hardly diffusible into the amorphous silicon and other semiconductors and is preferably a chromium or other metal material which shows good adhesion to the glass substrate board 113.

Then, amorphous silicon semiconductors parts 130 and 132 for use as photodiodes 114 and blocking diodes 116 are formed on the lower electrodes 126 and common electrodes 118, respectively. Among amorphous silicon semiconductors, one having N-type semiconductor layer, particularly of a PIN structure, is preferred for these semiconductor parts 130 and 132. And among such amorphous silicon semiconductors of PIN structure, one containing carbon C in its P-type semiconductor layer is particularly preferred. Superimposed on the semiconductor layers 130 and 132 thus deposited are transparent upper electrodes 134 and 136, respectively, which are made of ITO or the like. The semiconductor parts 130,132 and transparent electrodes 134,136 may be formed by photolithography after successive deposition of said semiconductor layer and transparent electrode layer. The semiconductor parts 130,132 and transparent electrodes 134,136 may also be formed in a pattern by the masking method.

Then, these photodiodes 114 and blocking diodes 116 are covered with a transparent interlayer insulating film 138 of, for example, SiOx or the like, whereby not only the photodiodes 114 and blocking diodes 116 but the electrode leads 128 extending from the lower electrodes 126 of photodiodes 114 are insulated. Thereafter, a metal film is deposited on said transparent interlayer insulating film 138 and photoetched to simultaneously provide the coupling electrodes 124 connecting the photodiodes 114 to the corresponding blocking diodes 116 and the matrix wiring 122 extending along the length of the glass substrate board 113. Each of the coupling electrodes 124 is connected to the transparent electrode 134 of the corresponding photodiode 114 through the contact hole 140, while it is connected to the transparent electrode 136 of the corresponding blocking diode 116 through the contact hole 142. By this coupling electrode 124, the photodiode 114 and blocking diode 116 are interconnected in series and opposite polarity. Here, the coupling electrode 124 is formed in such a manner that it covers at least the transparent electrode 136 of the blocking diode 116, thus shielding the blocking diode 116 from light so that it will not act as a photoelectric energy converting element. On the other hand, the matrix wiring 122 formed on the transparent interlayer insulating film 138 is electrically connected through the contact hole 144 at the leading end of the electrode conductor 128 extending from lower electrode 126 of each photodiode 114.

The electrode pads formed integrally with common electrodes 118 for connection to an external device are also preferably covered with a metal film at the same time as the formation of coupling electrodes 124 and matrix wiring 122 so as to provide output electrodes 146. The metal material for use in the formation of said coupling electrodes 124 and matrix wiring 122 should be such that, when deposited on the transparent electrodes 134,136 of photodiodes 114 and blocking diodes 116 through the contact holes 140,142, its metal atoms will not diffuse into the transparent electrodes 134,136 and semiconductor layers 130,132. Thus, for example, chromium, titanium and nickel may be mentioned. While the coupling electrodes 124 and matrix wiring 122 can be formed exclusively of such a non-diffusing metal material, there may be employed a two-layer or multiple layer structure such that the coupling electrodes 124 and matrix wiring 122 made of said non-diffusing metal are further covered with a good conductor material such as aluminum.

The photodiodes 114, blocking diodes 116 and matrix wirings 122 formed on the glass substrate 113 are further covered with an insulating protective film 148 except in the area corresponding to output electrode parts 146 of common electrodes 118 and output electrodes of the matrix wirings 122. The material for this insulating protective film 148 may be an inorganic insulating material such as SiNx, silicon nitride, an organic insulating material such as polyimide resin, epoxy resin, phenolic resin or the like, or a composite of inorganic and organic insulating materials.

Figure 6:
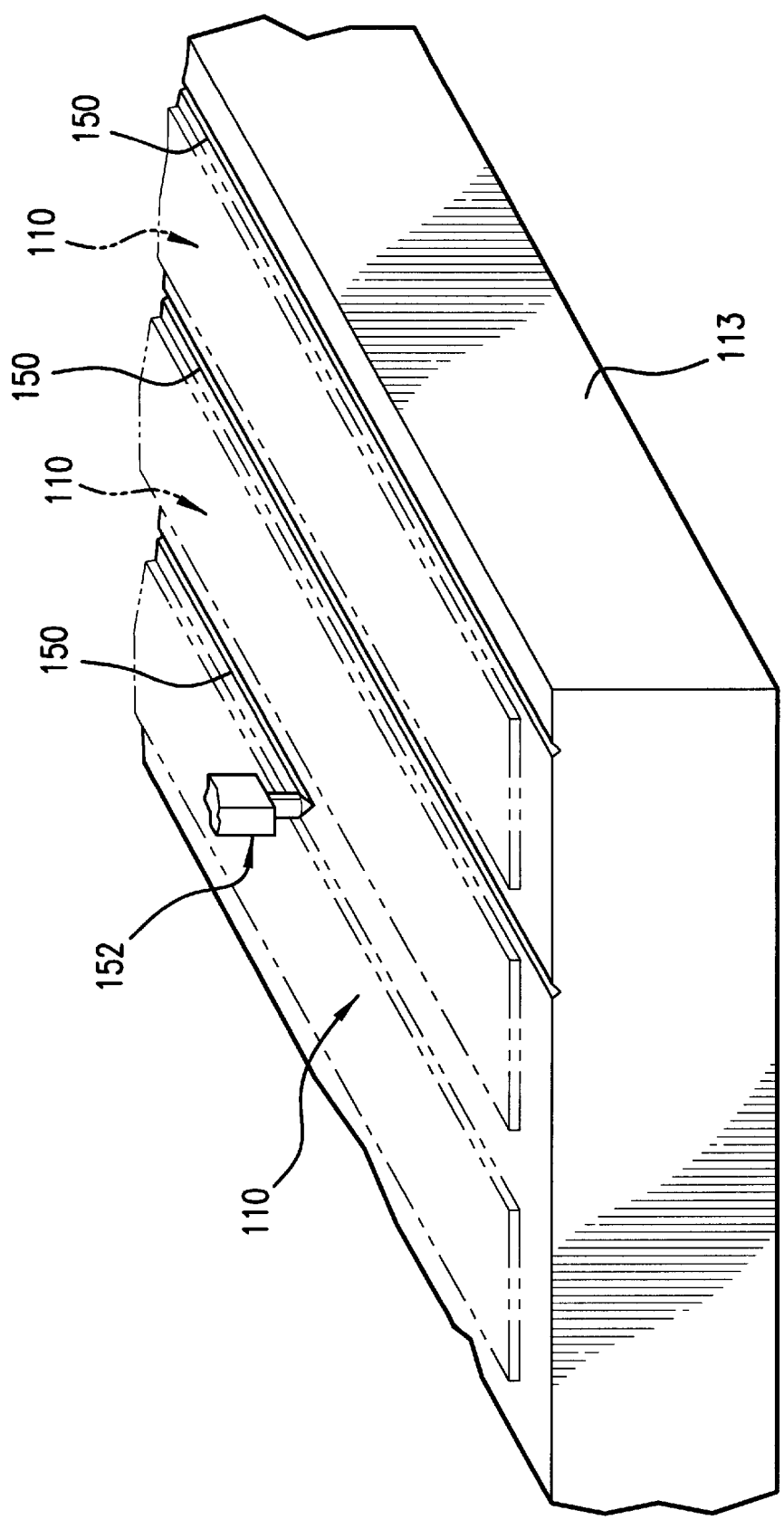
FIG. 6 is a perspective elementary view showing the method of cutting a glass substrate in the practice of the invention.

As shown in FIG. 4(b), the image sensor 110 of the above construction is formed in a plurality of units on a large-size glass substrate 113. This glass substrate 113 is then cut along scribing lines 150 to provide a plurality of linear image sensors 110 as shown in FIG. 4(a). As illustrated in FIG. 6, the scribing lines 150 are made by linear driving of a diamond cutter 152 having a sharp cutting edge applied against the surface of the glass substrate 113. Then, with the glass substrate 113 being held stationary at both sides of each scribing line 150, the substrate is broken by bending along the line. Because the thickness of the glass substrate 113 is 0.3 to 1.1 mm and preferably 0.4 to 0.8 mm, the glass substrate 113 is broken sharply and rectilinearly along the scribing line 150 even though its width in the subordinate scanning direction is 1.0 to 4.0 mm, so that individual sensor substrate strips 112 separated from a parent plate will not be fragmented during this cutting process. Moreover, since the glass substrate 113 is not subjected to an undue bending load in this breaking operation, the photodiodes 114, blocking diodes 116 and matrix conductors 122 formed on glass substrate 113 are kept intact.

Since the linear image sensor 110 thus fabricated has sharply cut glass edges, it can be easily positioned in assembling into a module, so that workability is improved. Particularly, since the scribe-break of a glass substrate 113 requires no cutting allowance, there is no waste of material and an increased number of linear image sensors can be obtained from a given large-area glass substrate 113. Moreover, when the thickness of the glass substrate 113 is reduced, the substrate can be broken by bending even if the sensor width in the subordinate scanning direction is narrow, so that the size of the sensor can be decreased.

The scribe-break of substrate glass 113 is comparatively easy when the glass is short in the main scanning direction and wide in the subordinate scanning direction. When the required length is 200 to 340 mm, i.e. A4 to A3 size, and the width of the linear image sensor 110 in the subordinate scanning direction is 1.9 to 3.5 mm, the substrate glass 113 can be accurately and safely broken along the scribing line 150 by selecting a glass substrate having a thickness of 0.5 too 0.75 mm. It has been confirmed that a glass substrate 113 can be broken accurately along a scribing line 150 without damaging the semiconductor elements and wiring formed thereon or breaking it into pieces when the ratio of the length in the main scanning direction to the width in the subordinate scanning direction is not less than about 150 and the ratio of the width in the subordinate scanning direction to the thickness of the substrate is not less than about 0.9 and preferably not less than 1.8.

Figure 5B:
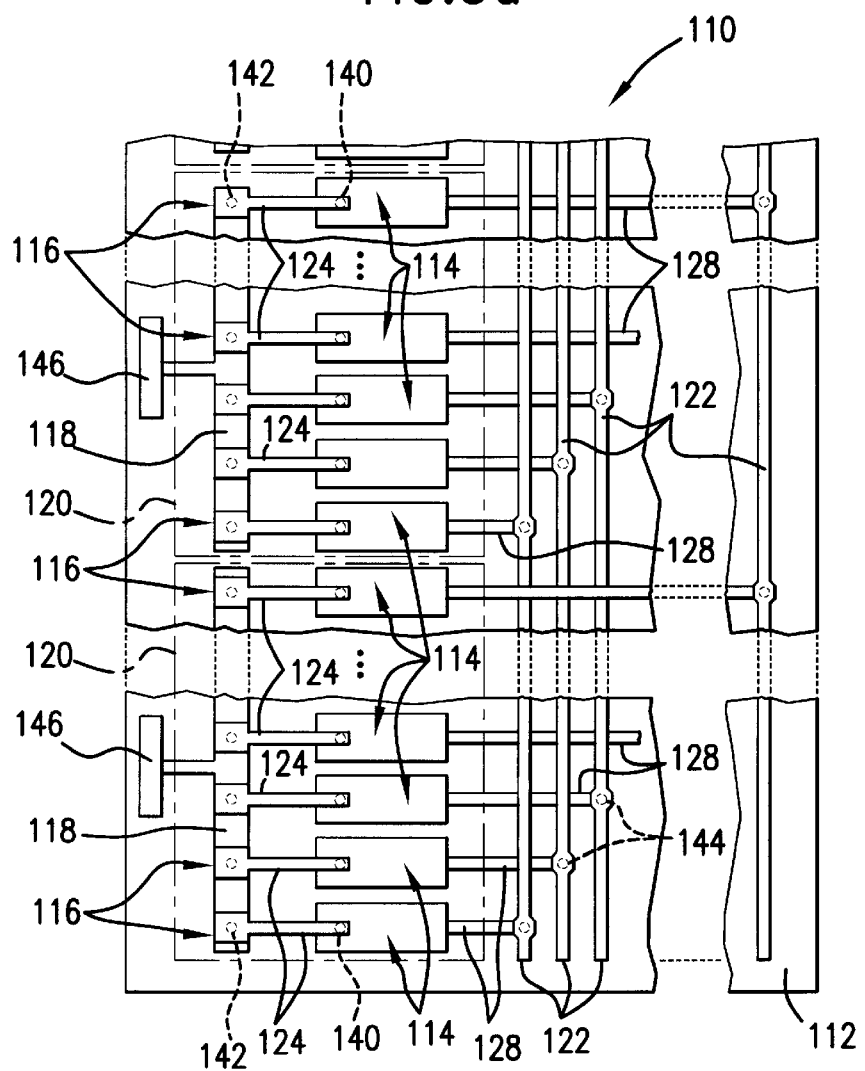

Using a 0.7 mm-thick glass substrate (7059; manufactured by Corning Glass), the inventors of the present invention fabricated a linear image sensor 110 as illustrated in FIG. 5. This glass substrate 113 measured 250 mm in the main scanning direction and 152 mm in the subordinate scanning direction. On the other hand, the contemplated dimensions of the substrate board 112 of the product linear image sensor 110 were 230 mm in the main scanning direction by 2.0 mm in the subordinate scanning direction. Using the above glass substrate sheet 113, 76 linear image sensors 110 were fabricated and the glass sheet was then scribed and broken to provide 76 linear image sensors 110. By the conventional cutting method using a dicer, which requires cutting allowances, only 63 linear image sensors 110 could be obtained from the same glass substrate 113.

In the practice of the present invention, the semiconductor layer is not limited to a PIN-type amorphous silicon semiconductor image sensor. Thus, it may be any of PIN, NIP, NI, PN, MIS, heterojunction, homojuction, Schottky-barrier and mixed type sensors fabricated by using amorphous or microcrystalline silicon semiconductors which include, among others, amorphous silicon a—Si, hydrogenated amorphous silicon a—Si:H, hydrogenated amorphous silicon carbide a—SiC:H, amorphous silicon nitride, etc., and alloys of silicon with carbon or any of germanium, tin and other metals. Aside from the above, the linear image sensor to which the invention is applicable includes those using other semiconductors such as GaAs, GdS and other types of semiconductors.

The insulating board includes not only glass substrate boards but also such substrate boards as can be fabricated by depositing silicon oxide, silicon nitride, silicon oxynitride or the like on a metal substrate and flexible boards such as polyimide and other films. Moreover, the material for lower electrodes need not necessarily be chromium but may for example be titanium or nickel. The material for said interlayer insulating film or insulating protective film may be silicon oxide, silicon nitride, silicon oxynitride or the like. Thus, any of those materials is virtually not limited in kind. Furthermore, the patterning of the interlayer insulating film is best performed by a dry etching technique such as reactive ion etching but if necessary, a wet etching technique may of course be employed.

Another example of the glass substrate board for the image sensor of the invention is now described in detail with reference to the accompanying drawings.

Figure 8A:
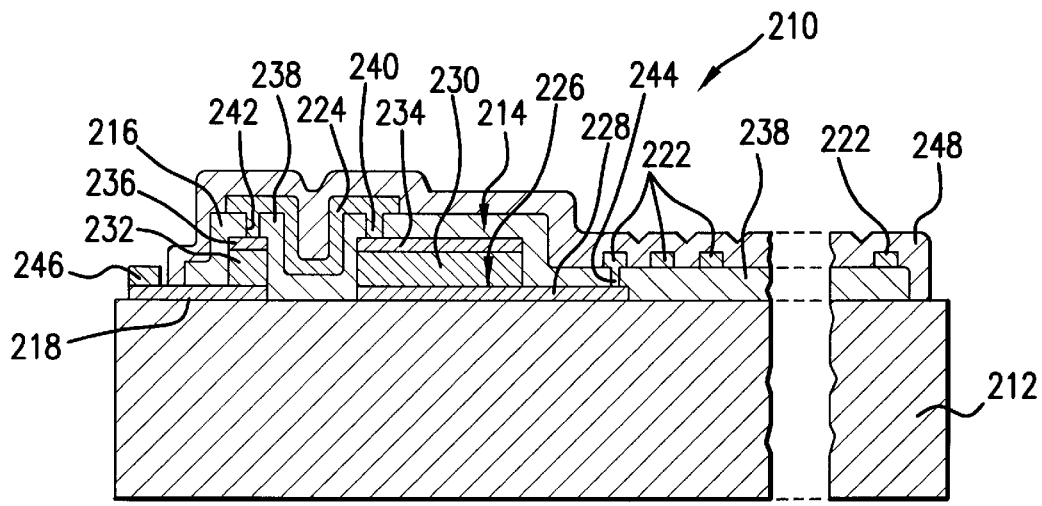
FIG. 8 is a view showing an image sensor as another embodiment of the invention, wherein (a) is a sectional elementary view of main components and (b) is an elementary plan view of the main components.

Referring to FIG. 8(a) and (b), the reference numeral 210 indicates an example of the linear image sensor fabricated using a glass substrate in accordance with the invention.

This linear image sensor 210 generally comprises a glass substrate board 212 and, as formed one-dimensionally thereon, a plurality of photodiodes 214 as photoelectric energy converting elements and a plurality of blocking diodes 216 which serve as switching elements for preventing the crosstalk between said photodiodes 214. Groups of these blocking diodes 216 are connected each by a common electrode 218 and this common electrode 218, a fixed number of blocking diodes 216 connected thereto, and a fixed number of photodiodes 214 corresponding to said blocking diodes 216 constitute a single block 220. Also formed on the glass substrate 212 is a matrix wiring 222, by which the photodiodes 214 in the same relative positions in respective blocks 220 are interconnected via contact holes 244. Furthermore, the photodiodes 214 are connected to the corresponding blocking diodes 216 in series and opposite polarity through respective coupling electrodes 224 via contact holes 240, 242 in the interlayer insulating film 238. These component elements, taken together, constitute the image sensor 210. The electrode pads 246 of common electrodes 218 in the respective blocks 220 and the electrode pads, not shown, of the matrix wiring 222 are disposed in the main scanning direction of the glass substrate board 212.

Figure 9:
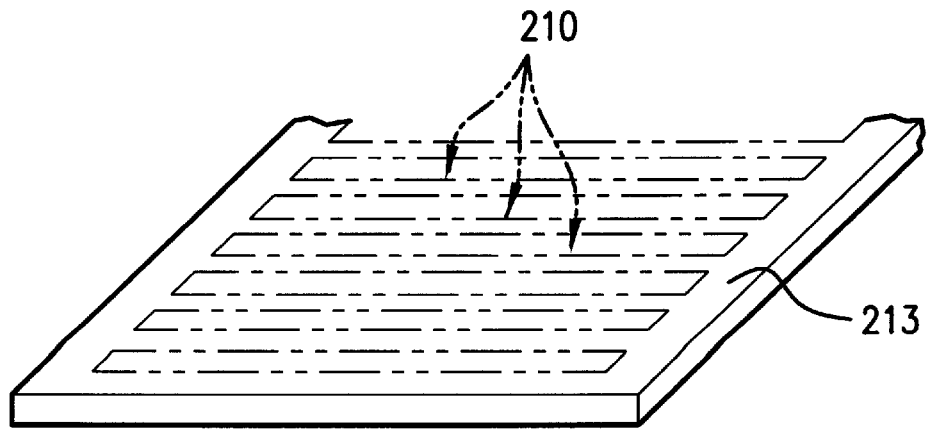
FIG. 9 is a perspective elementary view showing a step in the method for manufacture of an image sensor using a glass substrate board in accordance with the invention.
Figure 8B:
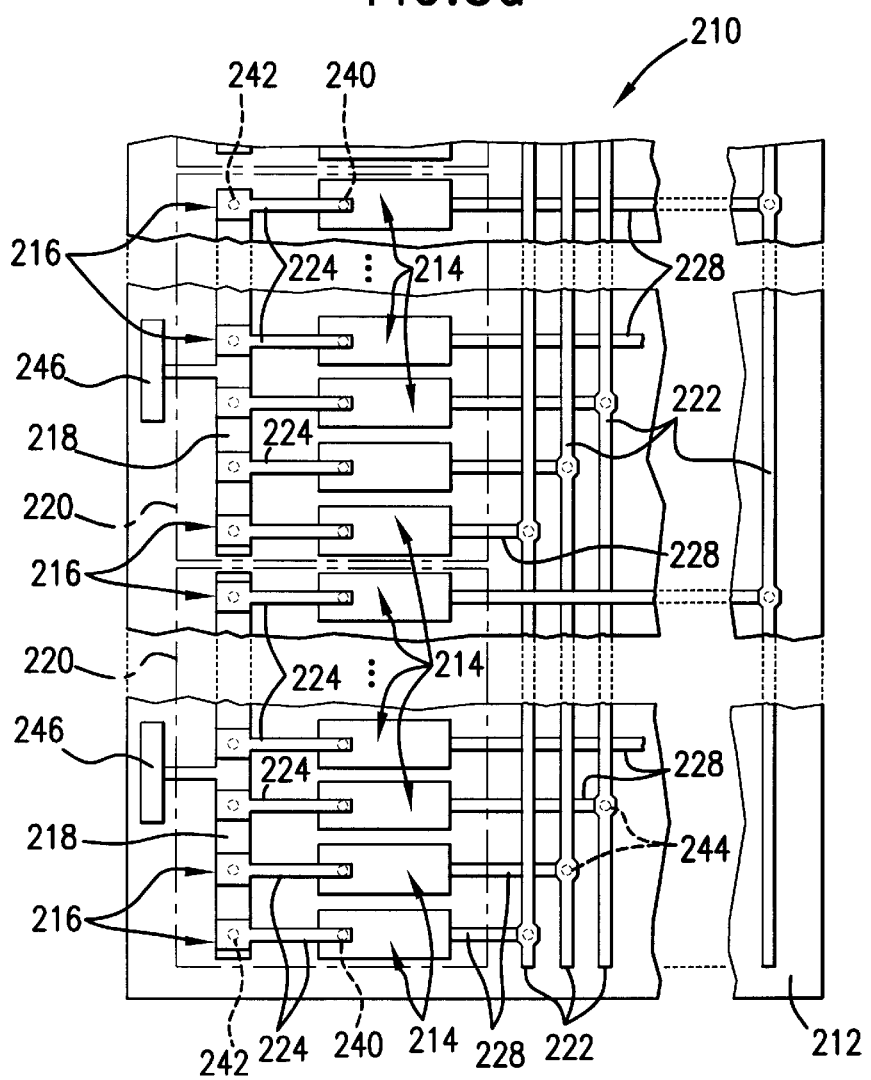

Such a linear image sensor 210 must be fabricated by repeating a complicated process of thin-film deposition and photofabrication and, therefore, to reduce the production cost, it is preferable to manufacture a substantial number of linear image sensors 210 in one operation. For this purpose, a large-area substrate glass sheet 213, as shown in FIG. 9, is provided and a plurality of linear image sensors 210 are then formed on this glass sheet 213 at one time by a conventional process. Then, as shown in FIG. 8, the glass sheet is divided in the main scanning direction by cutting or using a scriber-breaking machine to provide a plurality of product linear image sensors 210. Each of the photodiodes 214 and blocking diodes 216 formed on the glass substrate 212 (213) consists of a lower electrode 226 or a lower common electrode 218, a semiconductor layer 230, 232, and an upper transparent electrode 234, 236, and each of such upper electrode, semiconductor layer and lower electrode as well as the matrix wiring 222 which is also formed on the same glass substrate 212 (213) is formed as a thin film ranging from 800 Å to 16,000 Å in thickness.

Figure 7A:
FIG. 7 is an explanatory view showing the glass substrate board of an image sensor according to the invention, wherein (a) is a sectional elementary view showing the surface roughness of a glass substrate board on exaggerated scale and (b) is a front elementary view showing the curling of a glass substrate board.
Figure 7B:
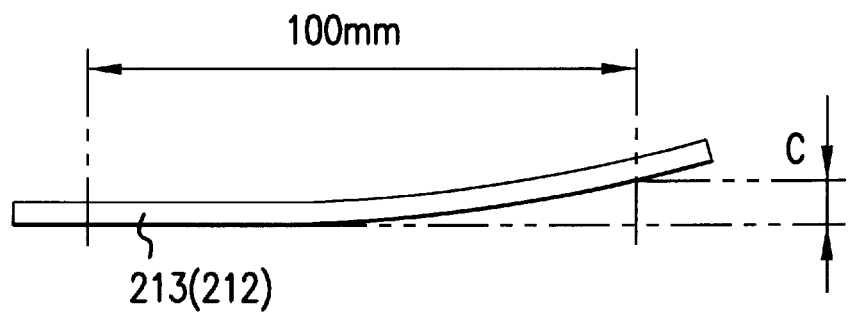

The glass substrate board 213 on which these thin films are formed may be an alkali-free glass substrate such as Corning Glass No. 7059 glass substrate, and the surface roughness or irregularity of the substrate 213 should be not more than 500 Å and preferably not more than 200 Å. The degree of curling of the glass substrate in the main scanning direction should be not more than 0.4 mm/100 mm length and preferably not more than 0.2 mm/100 mm length. The surface roughness is expressed in the maximum height H of the irregularity as shown in FIG. 7(a) and the surface roughness of the glass substrate 213 is evaluated according to the maximum height H measured as follows. Thus, a reference length is randomly set out on the glass substrate 213 and the maximum height H within the area corresponding to this reference length is tested against the above criterion of 500 Å, or preferably 200 Å, assuming that the maximum height in the other area is also the same. Moreover, as shown in FIG. 7(b), when the degree of curling C of the glass substrate 213 is not more than 0.4 mm per 100 mm length and preferably not more than 0.2 mm per 100 mm length, the glass substrate 213 is regarded as acceptable. The curl C of glass substrate 213 should be within the above range particularly in the main scanning direction. As to the degree of curling in the subordinate scanning direction, the above range is not critical if its degree is not so great as to interfere with the formation of semiconductor and other layers. This is because individual linear image sensors 210 are only as wide as about 1.5 mm to 5 mm and, therefore, the curl in the subordinate scanning direction is usually almost negligible.

When the surface roughness of glass substrate 213 is within the above range, the thin film deposited for the formation of lower electrodes by sputtering or vacuum vapor deposition of chromium completely covers up the surface irregularity and mars of the glass substrate 213 so that pinholes are seldom produced. Therefore, when this thin film is patterned by photolithography, it does not happen, in all probabilities, that the lead conductors are broken or the wiring resistance is increased due to pinholes. The thin film is deposited faithfully copying the surface configuration of the glass substrate 213 and the photoresist for patterning is superimposed thereon in the spin coating stage. Since the maximum height (H) of the surface irregularity of the thin film is within the abovementioned range, it does not happen that, in the spin coating process, a defect of photoresist is created behind the irregularity or the photoresist layer becomes uneven to cause poor patterning. The same applies to the semiconductor layer, upper electrode layer and interlayer insulating layer which are built up on the lower electrode layer.

Moreover, when the degree of curling C of the glass substrate 213 is within the above range at least in the main scanning direction, almost perfect focusing is possible in the exposure step of the photofabrication process so that no patterning defect takes place. Furthermore, when the electrical characteristics of the plural linear image sensors 210 formed on the glass substrate board 213 are tested by bringing the one-dimensionally disposed styluses of a testing probe into contact with the plurality of electrode pads 246 disposed in the main scanning direction as shown in FIG. 8, the probe styluses contact the corresponding electrode pads 246 exactly to yield accurate test data because the degree of curling C of the selected glass substrate 213 in the main scanning direction is not more than 0.4 mm and preferably not more than 0.2 mm per 100 mm length. Moreover, when a discrete linear image sensor 210 is bonded to a flat supporting board, the curled substrate glass 212 is straightened of necessity. This may damage the semiconductor elements and matrix conductors formed on the glass substrate 212. However, when the degree of curling C of the glass substrate 212 is within the above-mentioned range, the amount of deformation is so small that these component elements are not damaged. Furthermore, when the glass substrate 213 is positioned by suction for the spin coating of a photoresist, the substrate 213 with such a limited curl C can be adequately sucked up so that the risk of breakage due to suction failure can be obviated. In addition, when the glass substrate 213 is scribed and broken, the bending force acts uniformly along the scribing line so that the cross section is approximately at right angles with the surface of the glass substrate 213.

Furthermore, because an alkali-free glass is used for the glass substrate 213, it does not happen that the alkali diffuses out into the lower electrodes and wiring electrodes formed on the glass substrate 213 to form sodium chromate which is water-soluble. Therefore, it does not happen that pinholes are formed in the electrodes on the glass substrate 213 (212) and, hence, the reliability of the linear image sensor is improved.

While the foregoing is a description of one embodiment of the present invention, the invention can be reduced to practice in still other modes.

Figure 10A:
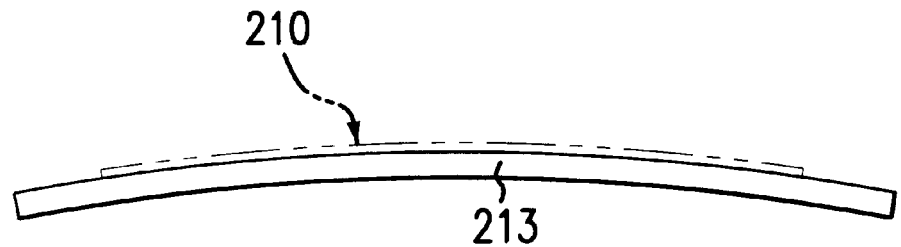
FIG. 10 is a view showing another method of manufacturing an image sensor using a glass substrate board in accordance with the invention, wherein (a) is a front view and (b) is a front elementary view showing an image sensor mounted on a supporting board.
Figure 10B:
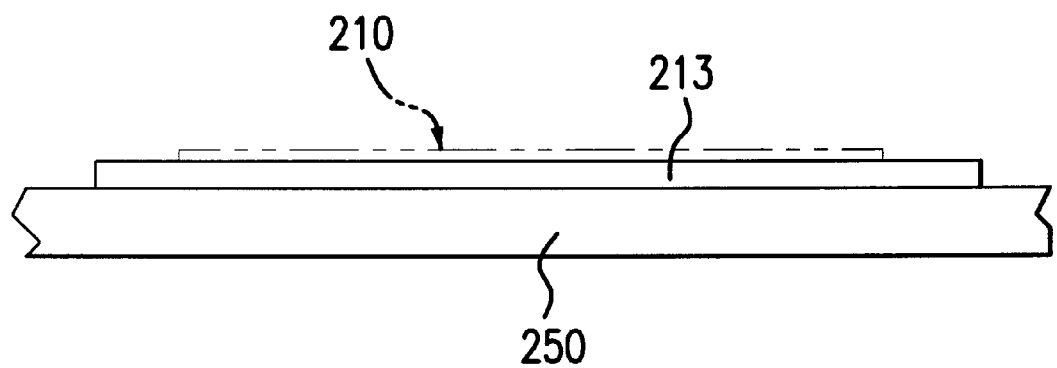

For example, as shown in FIG. 10(a), one may use a substrate glass sheet 213 having a sufficient area to provide a plurality of linear image sensors 210 and a degree of curling of not more than 0.4 mm, preferably not more than 0.2 mm, per 100 mm length and form the necessary semiconductor elements and wiring conductors on the side of the glass sheet which corresponds to the convex side of the curl. The thin films necessary for the formation of lower electrodes, semiconductor layers and upper electrodes on the glass substrate 213 are deposited at a high temperature, while these are only at ordinary temperature when the image sensor is mounted on a supporting board 250 or the like as shown in FIG. 10(b). Therefore, residual tensile stresses are inevitable in the lower electrodes 218,226, etc. which have been formed at high temperature and patterned on the glass substrate 213 having a low coefficient of thermal expansion. Therefore, when the semiconductor elements including lower electrodes 218, 226 and wirings are formed on the convex side of the glass substrate 213 (212) and any of the linear image sensors 210 thus fabricated is taken and bonded to a flat supporting board 250, the glass substrate board 212 is straightened to cancel the residual tensile stresses in the lower electrodes 218, 226 and other component elements. It should be understood, in this connection, that when the degree of curling C of the substrate glass sheet 212 is large, a compressive force acts on the semiconductor elements and wiring and may damage the sensor.

In the practice of the present invention, the semiconductor layer is not limited to PIN-type amorphous silicon semiconductor image sensors. Thus, it may be any of PIN, NIP, NI, PN, MIS, heterojunction, homojunction, Schottky-barrier and mixed type sensors made from amorphous or microcrystalline silicon semiconductors which include, among others, amorphous silicon a—Si, hydrogenated amorphous silicon a—Si:H, hydrogenated amorphous silicon carbide a—SiC:H, amorphous silicon nitride, etc., and alloys of silicon with carbon or any of germanium, tin and other metals. Aside from the above, the linear image sensor to which the invention is applicable includes those using other semiconductors such as GaAs, CdS and other types of semiconductors.

The material for lower electrodes need not necessarily be chromium but may for example by titanium or nickel. The material for said interlayer insulating film or insulating protective film may be silicon oxide, silicon nitride, silicon oxynitride or the like. Thus, any of these materials is virtually not limited in kind. Furthermore, the patterning of the interlayer insulating film is best performed by a dry etching technique such as reactive ion etching but if necessary, a wet etching technique may of course be employed.

Another example of the glass substrate board for the image sensor of the invention is now described in detail with reference to the accompanying drawings.

Referring to FIG. 11, the reference numeral 310 indicates an image sensor of the present invention. This image sensor 310 comprises a plurality of blocks 318 each comprising a plurality of photodiodes (photo-electric energy converting elements) 314 and a plurality of blocking diodes 316 as formed one-dimensionally on a common glass substrate board 312, with anodes of said blocking diodes 316 in each block being connected by a drive wiring 320 and anodes of said photodiodes 314 in the same relative positions within respective blocks 318 being interconnected by read-out wirings 322.

In this image sensor 310, drive terminals 324 at ends of the drive conductors 320 are grouped in predetermined numbers and disposed in a plurality of positions on the substrate board 312. This arrangement is the most outstanding feature of this embodiment. In addition, these drive terminals 324 and read-out terminals 326 at ends of read-out conductors 322 are disposed only along one length-wise side of the glass substrate 312.

Figure 12:
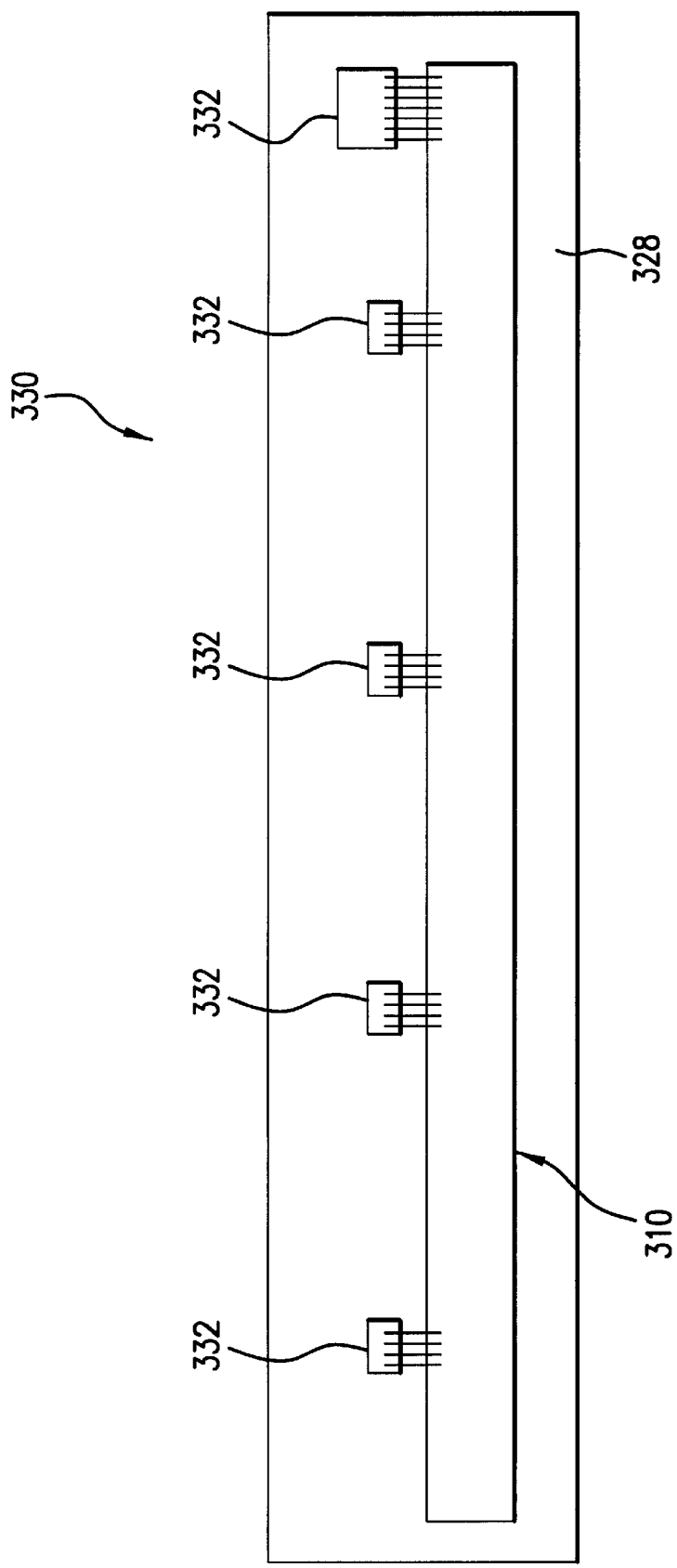
FIG. 12 is a plan view showing the image sensor module employing the image sensor of FIG. 11.

As illustrated in FIG. 12, this image sensor 310 is bonded onto a printed circuit board 328 for use as an image sensor module 330. Mounted on this printed circuit board 328 are a plurality of driving IC's 332 corresponding to the drive terminals 324 of the image sensor 310 and these driving IC's 332 are directly connected to the drive terminals 324 by wire bonding. Also mounted on the printed circuit board 328 is a read-out IC 334 which is directly connected to the read-out terminals 326 of the image sensor 310 by wire bonding. Therefore, compared with the image sensor module 424 in use today, the number of wire bonds is almost halved.

Since each of said driving IC's 332 is connected to a predetermined number of drive terminals 324, the known universal type driving IC's can be used for this purpose. Therefore, it is no longer necessary to construct an exclusive driving IC according to the size of the image sensor and a considerable cost reduction is realized. Moreover, the design, manufacturing and maintenance of the image sensor are all greatly facilitated.

Taking an A4 size image sensor having a resolution of 8 dots/mm as an example, the required number of photodiodes and blocking diodes is 1728 each. Therefore, when these elements are divided in blocks of 16, the number of drive terminals is 108. Therefore, when a driving IC having 28 terminals is used, the drive terminals are divided in groups of 28 and disposed collectively in 4 positions on the substrate board. Thus, the required number of driving IC's is 4. However, 4 terminals (28×4−108=4) are superfluous in this case but these may be left unused. Thus, in this image sensor 310, the same number of drive terminals 324 as the number of terminals of the universal driving IC 332 may be disposed collectively in a given area of the substrate 312.

In the case of a B4 size image sensor, all that is necessary is to provide 5 driving IC's of the above type and it is not necessary to construct any special driving IC. Thus, even if the image sensors vary in size, they can be successfully packaged into modules by increasing or decreasing the number of driving IC's. Moreover, since these individual diving ICs, the total cost is reduced despite the large number of units required.

Furthermore, since drive wirings 320 are formed on the substrate board 312, they are less susceptible to the influence of noise as compared with the case in which they are on the printed circuit board. Moreover, since the drive terminals 324 are disposed in discrete groups along the length-wise direction of the substrate board 312 and the drive conductors 320 are also similarly disposed, it does not occur that the drive conductors increase the lateral width of the sensor as it is the case with the prior art image sensor. Therefore, a larger number of image sensors 310 can be obtained from a single large-area substrate and this is a major cost advantage. Moreover, since the drive terminals 324 and read-out terminals 326 are disposed along one lateral side on the board 312, the width of the image sensor 310 is narrower.

Figure 13:
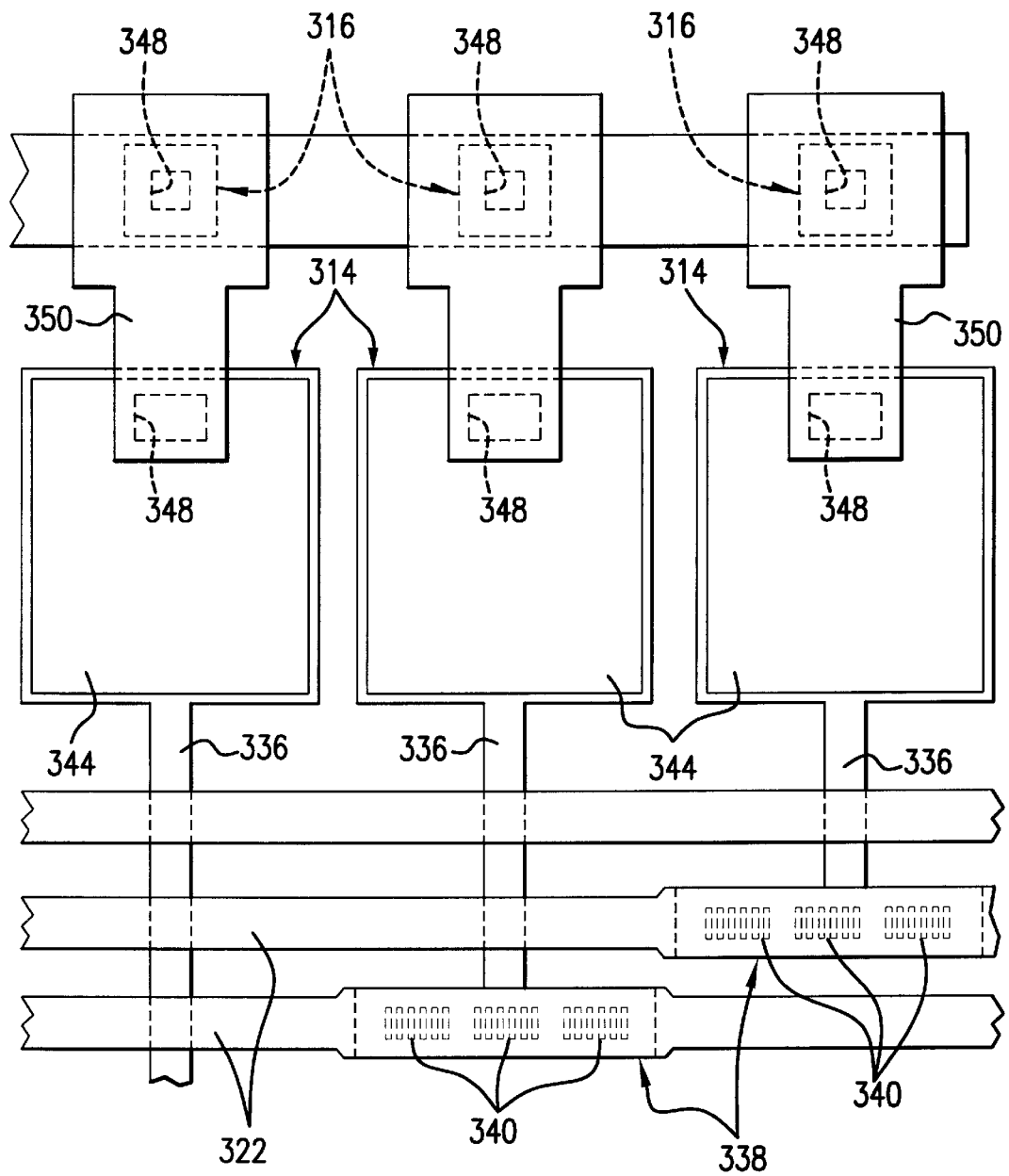
FIG. 13 is a plan view showing a portion of the image sensor of FIG. 11 on exaggerated scale.

On the other hand, as shown in FIG. 13, the read-out conductors 322 and lead conductors 336 from anodes of photodiodes 314 of this image sensor 310 are connected through 3 contact holes 340 and the line-width of the read-out conductors 322 at these connections 338 is made broader than the line-width in the remainder of the read-out wiring 322. For this reason, the are of contact of these conductors 332 and 336 is large enough to insure a low and stable contact resistance. Moreover, the chances for poor contact are reduced and the variation in bright output and dark output is minimized so that stable outputs with a high S/N ratio can be insured. It may be so arranged that at the intersections of the read-out conductors 322 with the lead conductors 336, the line-width of each conductor is made narrower than the remainder of the conductor so as to minimize the capacity coupling between the read-out conductor 322 and lead conductor 336.

Figure 14:
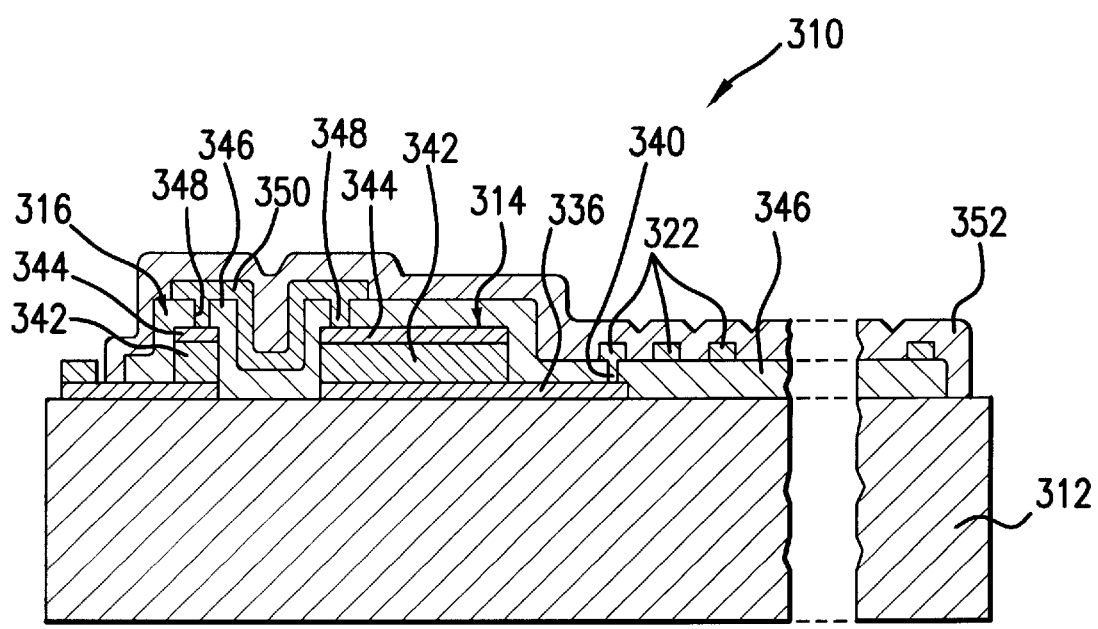
FIG. 14 is a sectional view showing the construction of the image sensor shown in FIGS. 11 and 13.

The construction of this image sensor 310 is as shown in FIG. 14. Thus, photodiodes 314 and blocking diodes 316 are all formed from the same amorphous silicon semiconductor layer 342 and an ITO transparent electrode 344 is formed on top of these semiconductor layer 342. Moreover, the photodiodes 314 and blocking diodes 316 are covered with a transparent interlayer insulating film 346 of, for example, SiOx and connected by coupling conductors 350 through contact holes 348 formed in this transparent interlayer insulating film 346. In addition, this whole assembly is covered with an insulating protective film 352 of, for example, SiNx.

This image sensor 310 is used as built into the document reader of a facsimile device or the like, and is a contact image sensor with which a document is read by focusing an erect-image isometric image thereof on photodiodes 314 by means of a converging rod lens array or the like.

Figure 15:
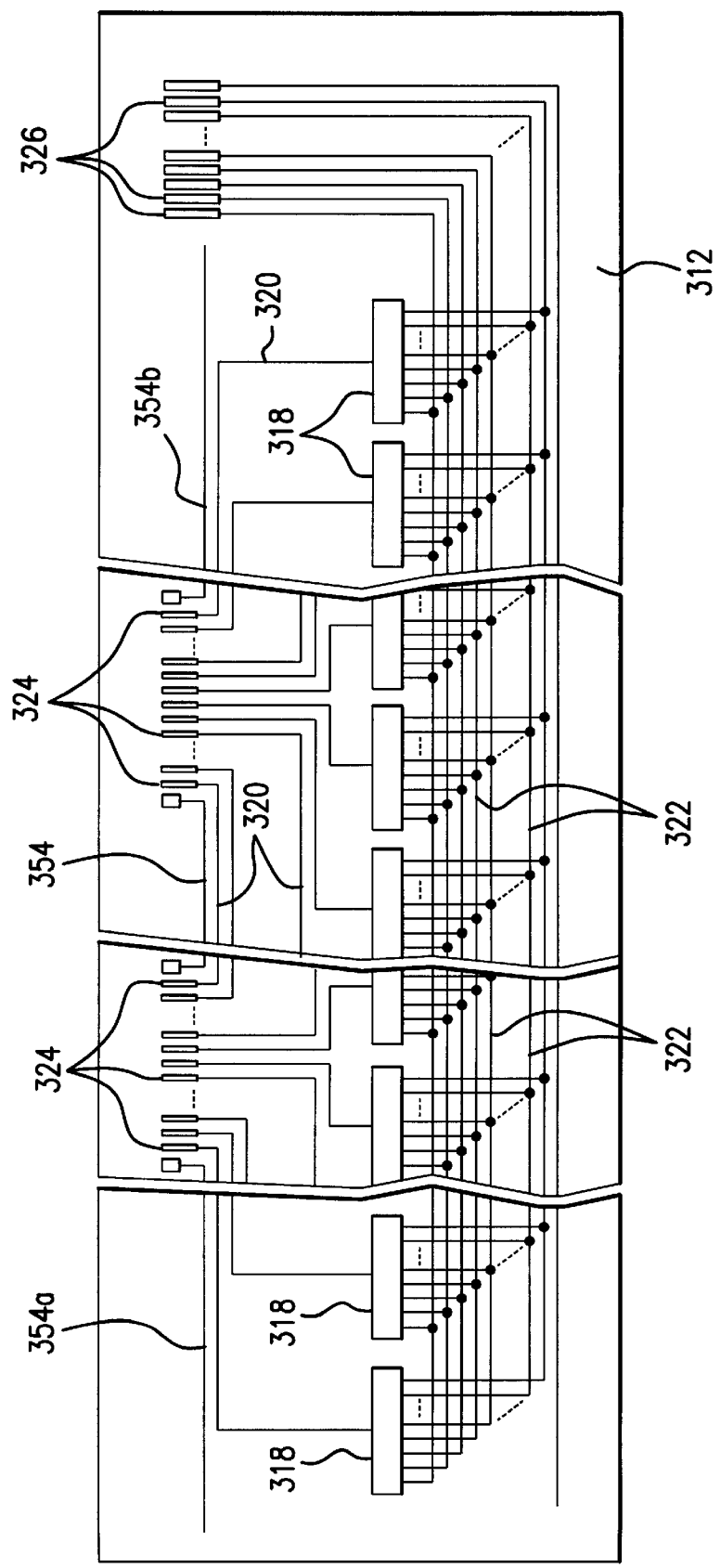
FIG. 15 is a partially exploded arrangement view showing another image sensor of the invention.

Various modifications may be made in the above image sensor of the invention. For example, a dummy wiring 354 may be provided near the drive wiring 320 collectively disposed as shown in FIG. 15. Unlike the case in which all the drive conductors are disposed at equal pitches, the collective disposition of drive conductors 320 in several positions generates an uneven floating capacity between drive conductors 320 so that a variation takes place in line impedance of the respective drive conductors 320, which may cause noise. However, when such dummy conductors 354 are provided, the variation in output between driving IC's 332 is decreased and the noise is accordingly reduced.

These dummy conductors 354 are preferably grounded but the first and the last dummy conductors 354a, 354b may be connected to the surplus terminals of the driving IC 332 and a driving pulse be applied to these dummy conductors 354a, 354b before and after the driving pulse is applied to the normal drive conductors 320. In this case, the capacitance kick due to the rise of the driving pulse applied to the first drive conductor 320 is offset by the fall of the driving pulse applied to the first dummy conductor 354a, while the capacitance kick due to the fall of the driving pulse applied to the last drive conductor 320 is offset by the rise of the drive pulse applied to the last dummy conductor 354b. The result is that the noise is remarkably reduced.

Figure 16:
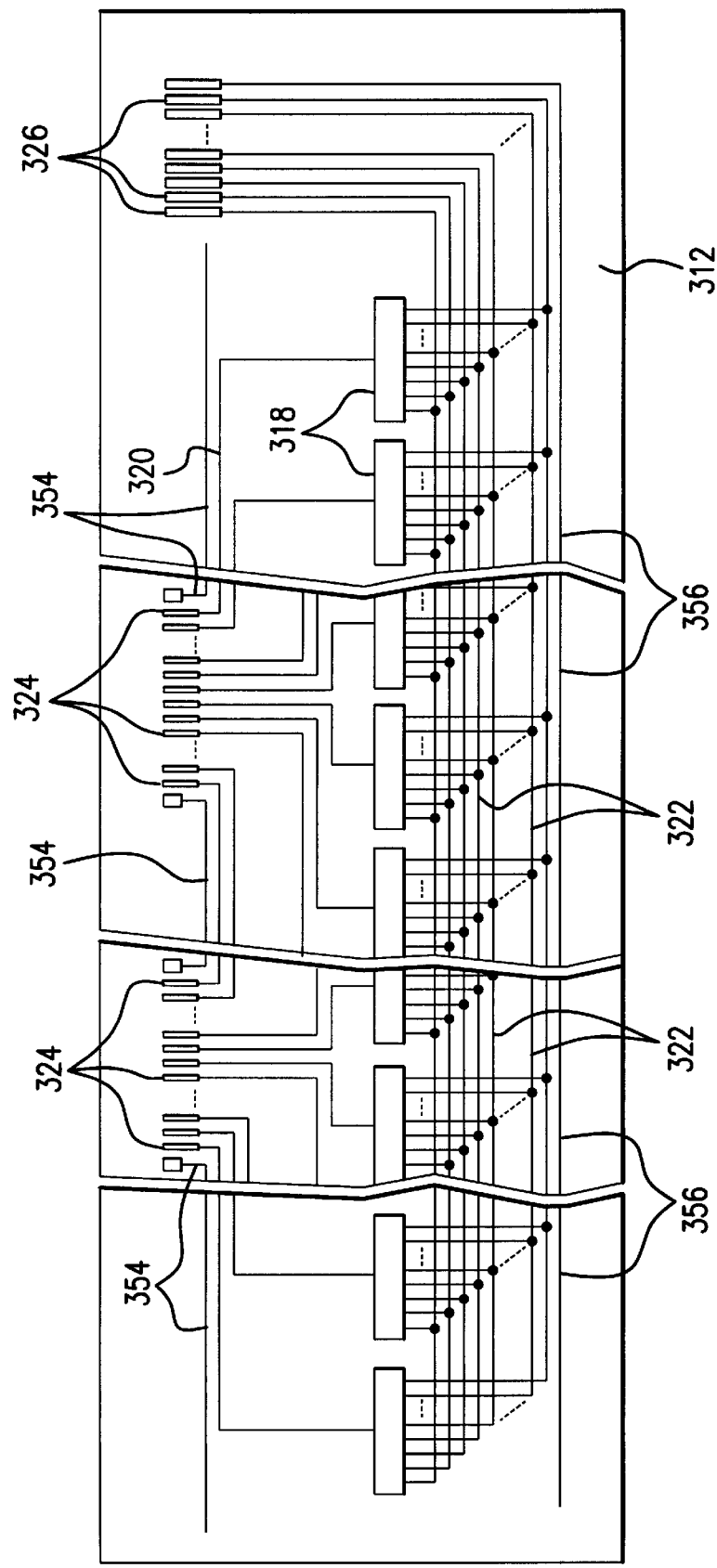
FIG. 16 is a partially exploded arrangement view showing still another image sensor of the invention.
Figure 17:
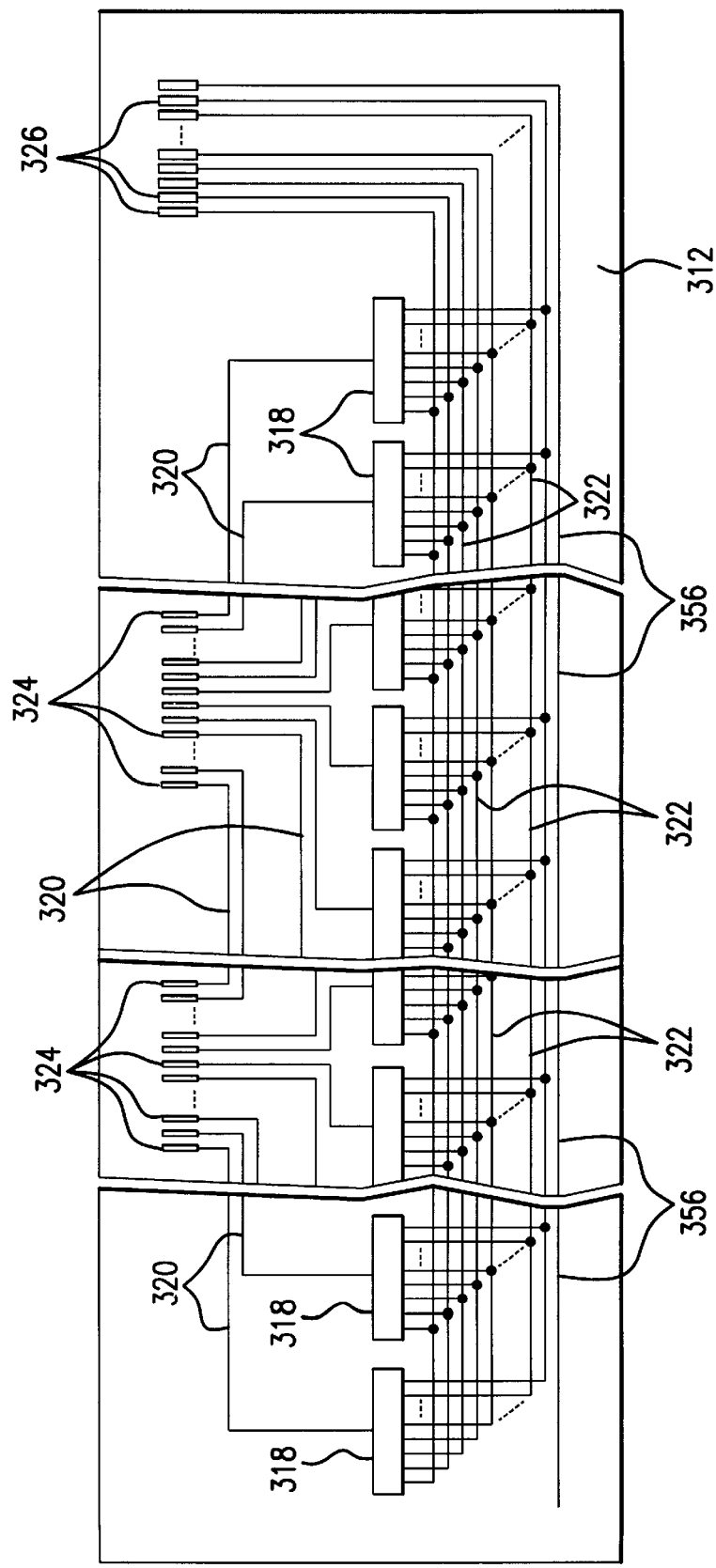
FIG. 17 is a partially exploded arrangement view showing still further image sensor of the invention.

Furthermore, as shown in FIG. 16, a dummy wiring 356 may be disposed near the read-out wiring 322 as well as near the drive wiring 320 or, as shown in FIG. 17, such dummy wiring 356 may be provided only near the read-out wiring 322. In this arrangement, the noise on the read-out wiring 322 side is reduced.

Figure 18:
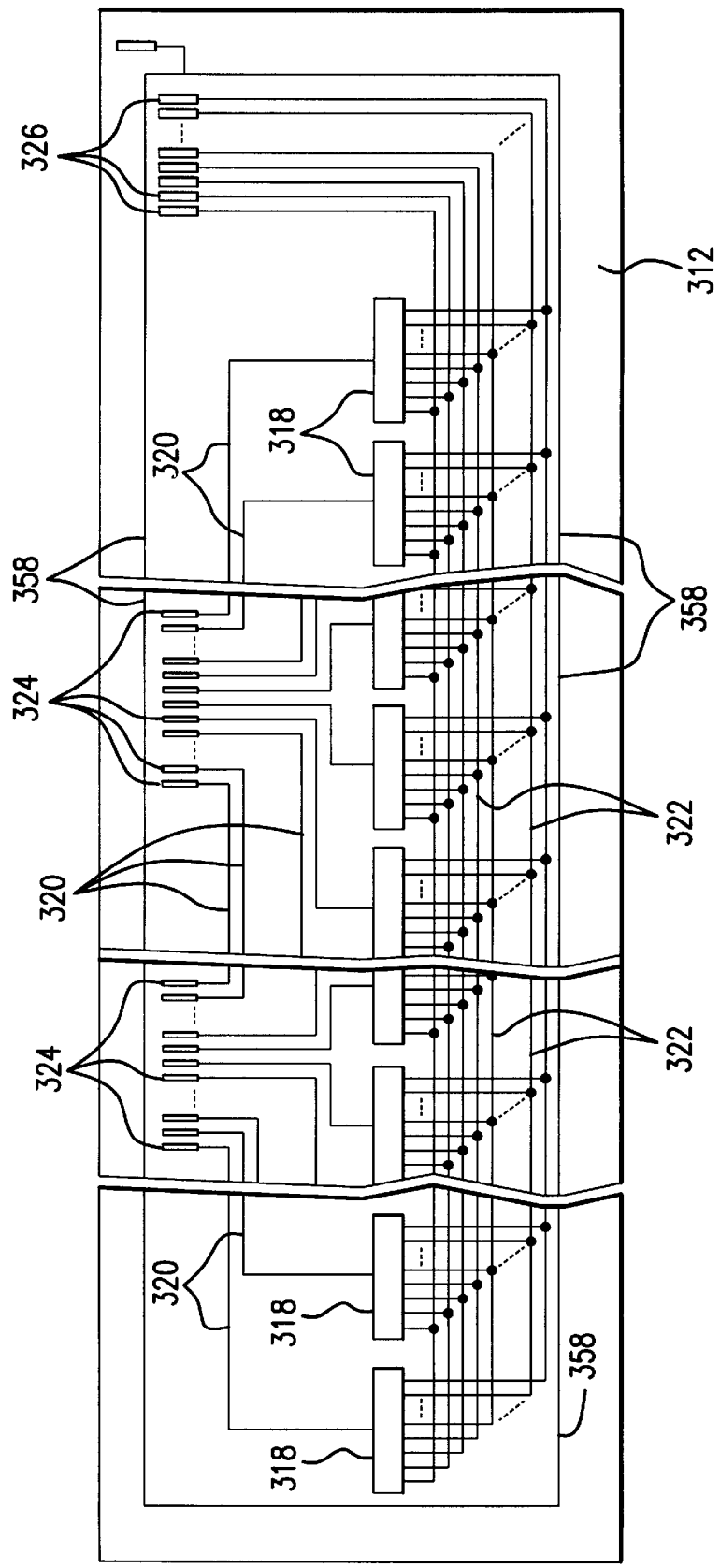
FIG. 18 is a partially exploded arrangement view showing another yet image sensor of the invention.
Figure 19A:
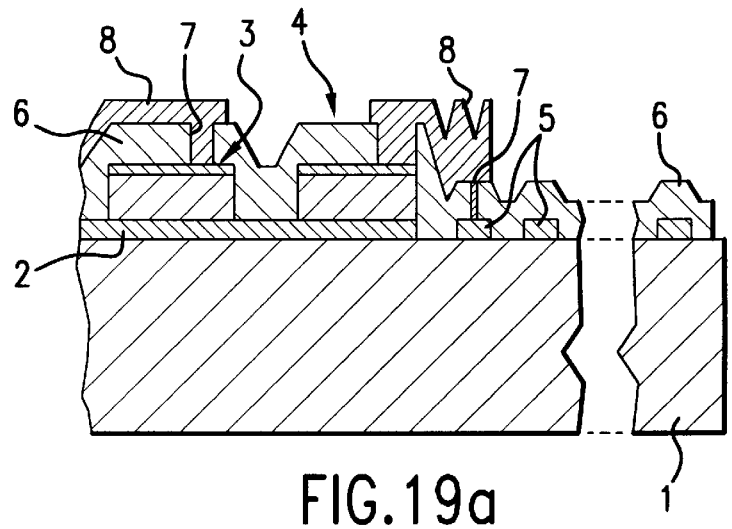
FIG. 19 is an explanatory view of the conventional image sensor, wherein (a) is a front sectional view of main components and (b) is a plan view of main components.
Figure 19B:
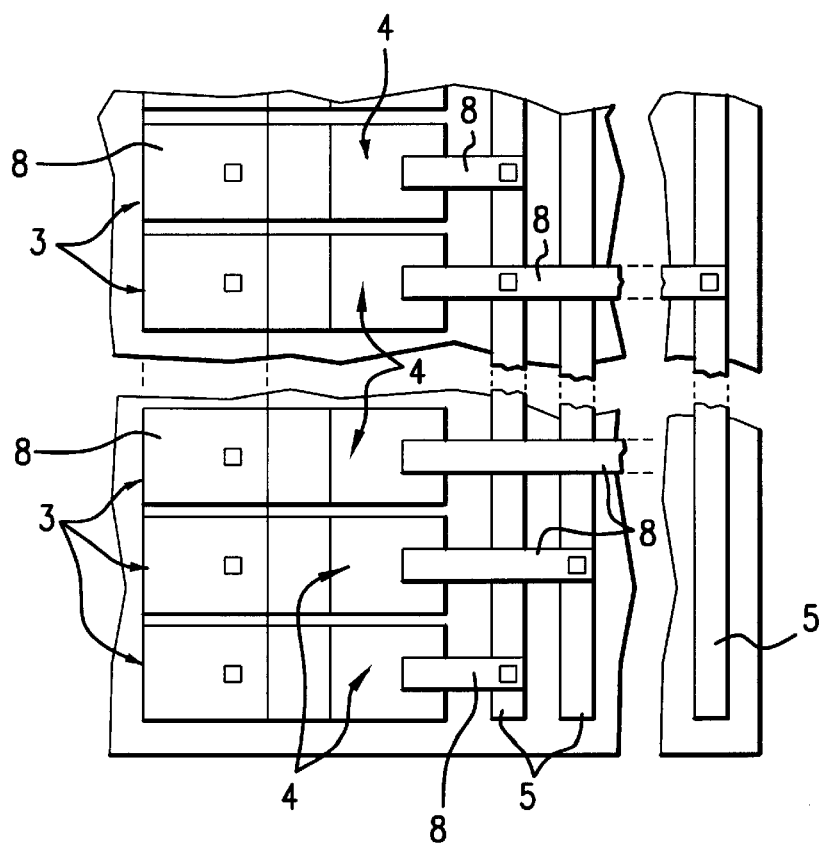
Figure 20:
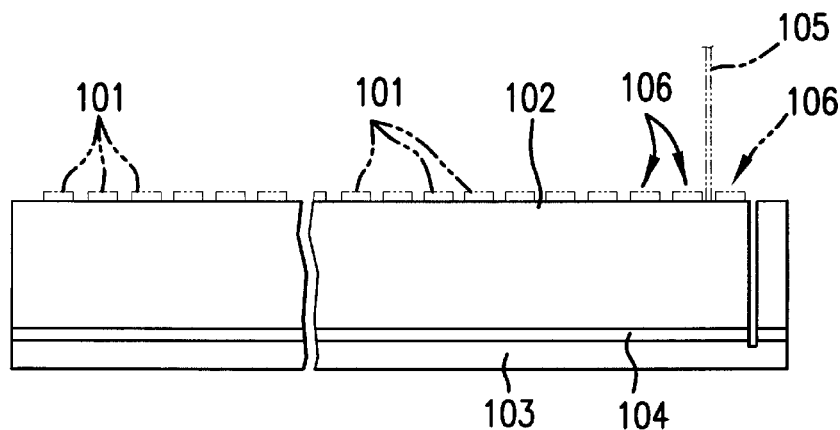
FIG. 20 is a front elementary view showing the drawback of the conventional manufacturing method for image sensors.
Figure 21:
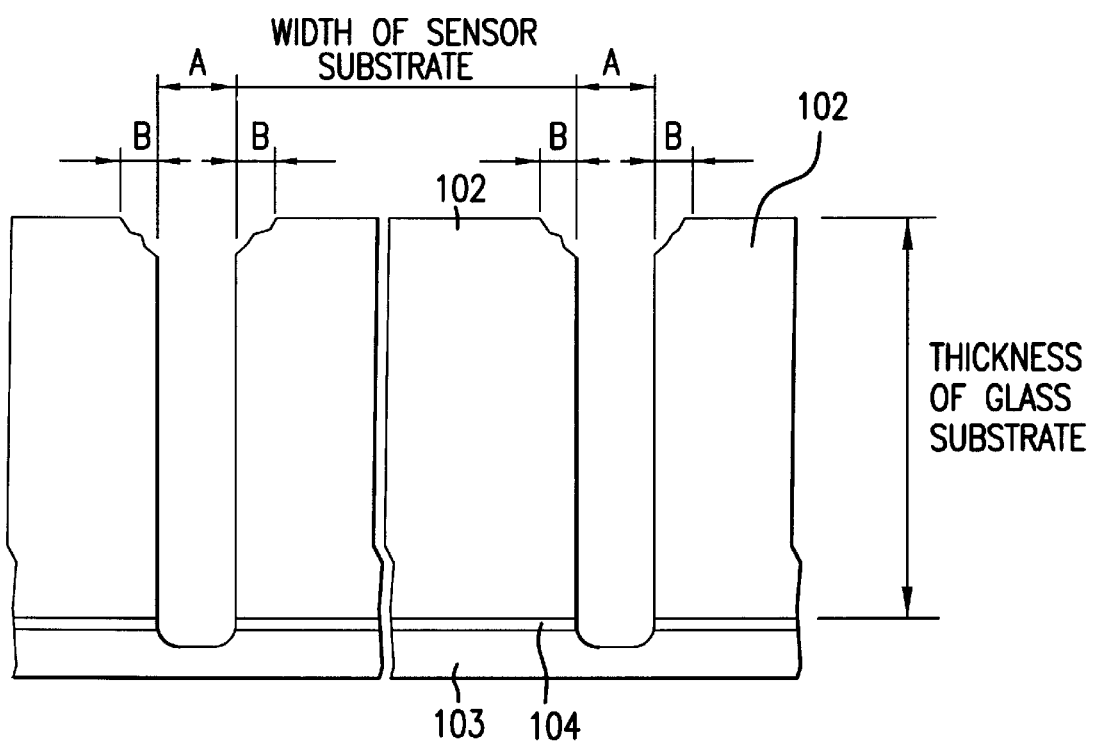
FIG. 21 is a fragmentary front view of main components on exaggerated scale, showing the drawback of the conventional manufacturing method for the glass substrate of an image sensor.
Figure 22:
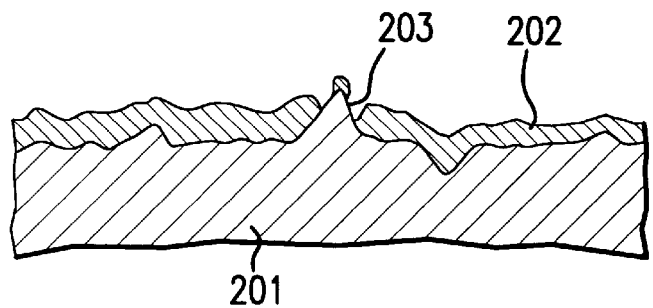
FIG. 22 is a sectional front view of the main part on exaggerated scale, showing the defect caused in the conventional image sensor when the surface irregularity of the glass substrate is large.
Figure 23:
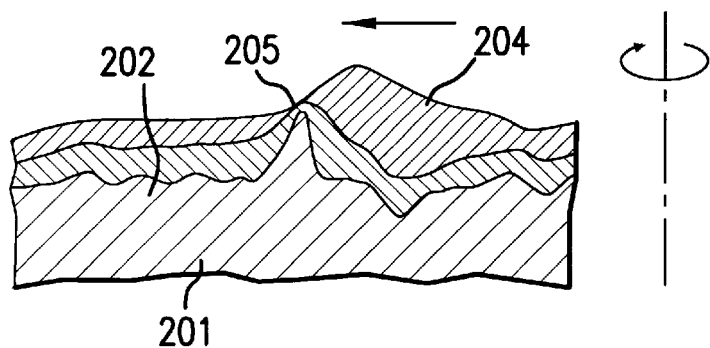
FIG. 23 is a sectional view showing another defect caused in the conventional image sensor when the surface irregularity of the glass substrate is large.
Figure 24:
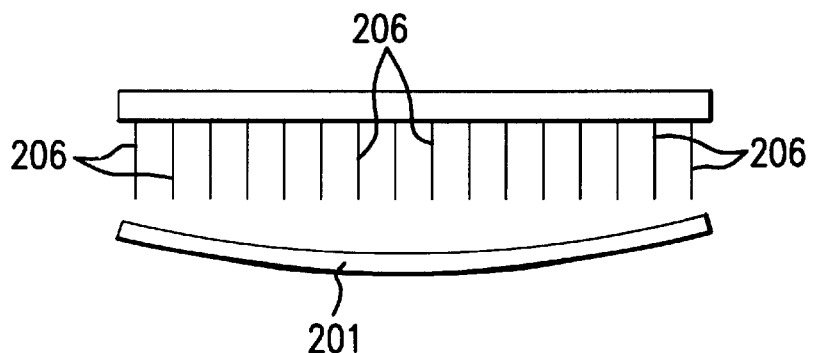
FIG. 24 is a front view showing the defect caused in the conventional image sensor when the degree of curling of the glass substrate is larger.
Figure 25A:
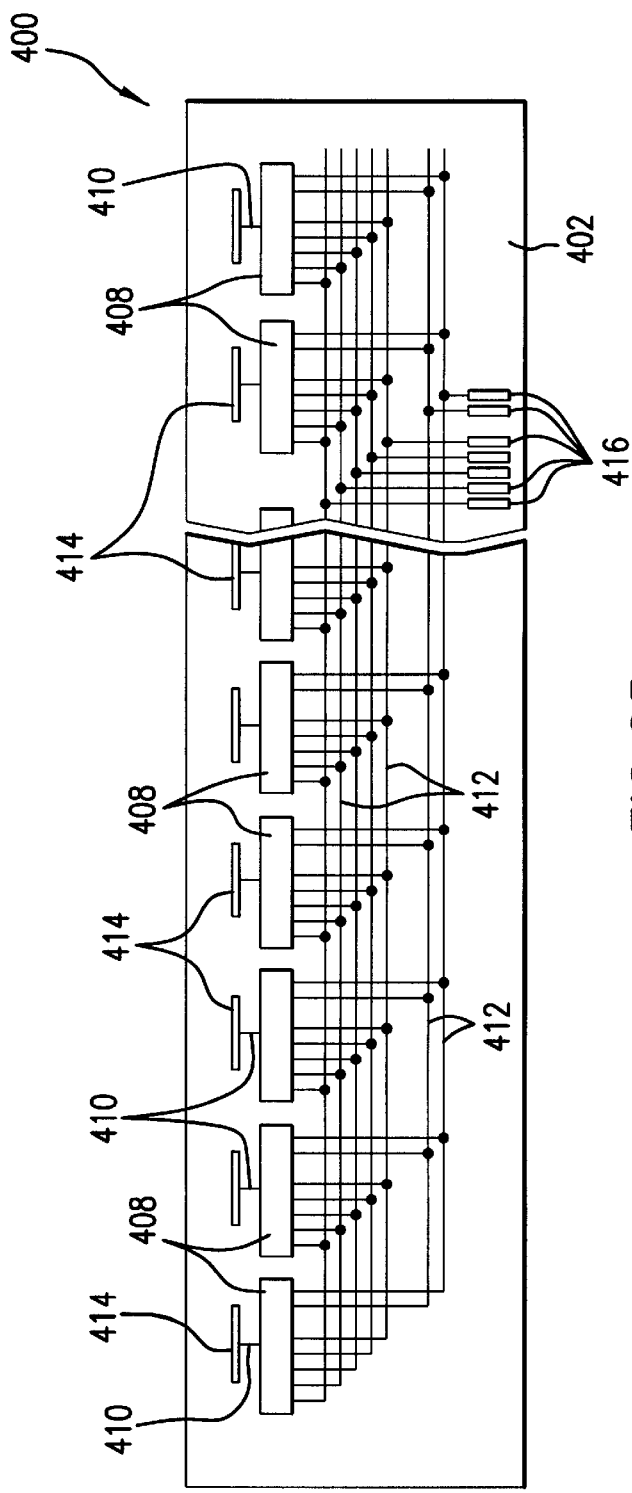
FIG. 25 is a view showing an image sensor currently in use, wherein (a) is a fragmentary arrangement view and (b) is a block wiring diagram.
Figure 25B:
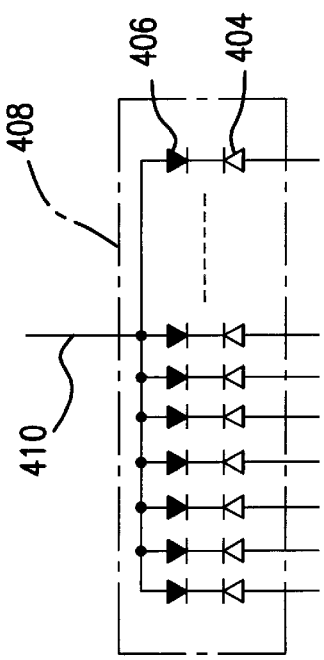
Figure 26:
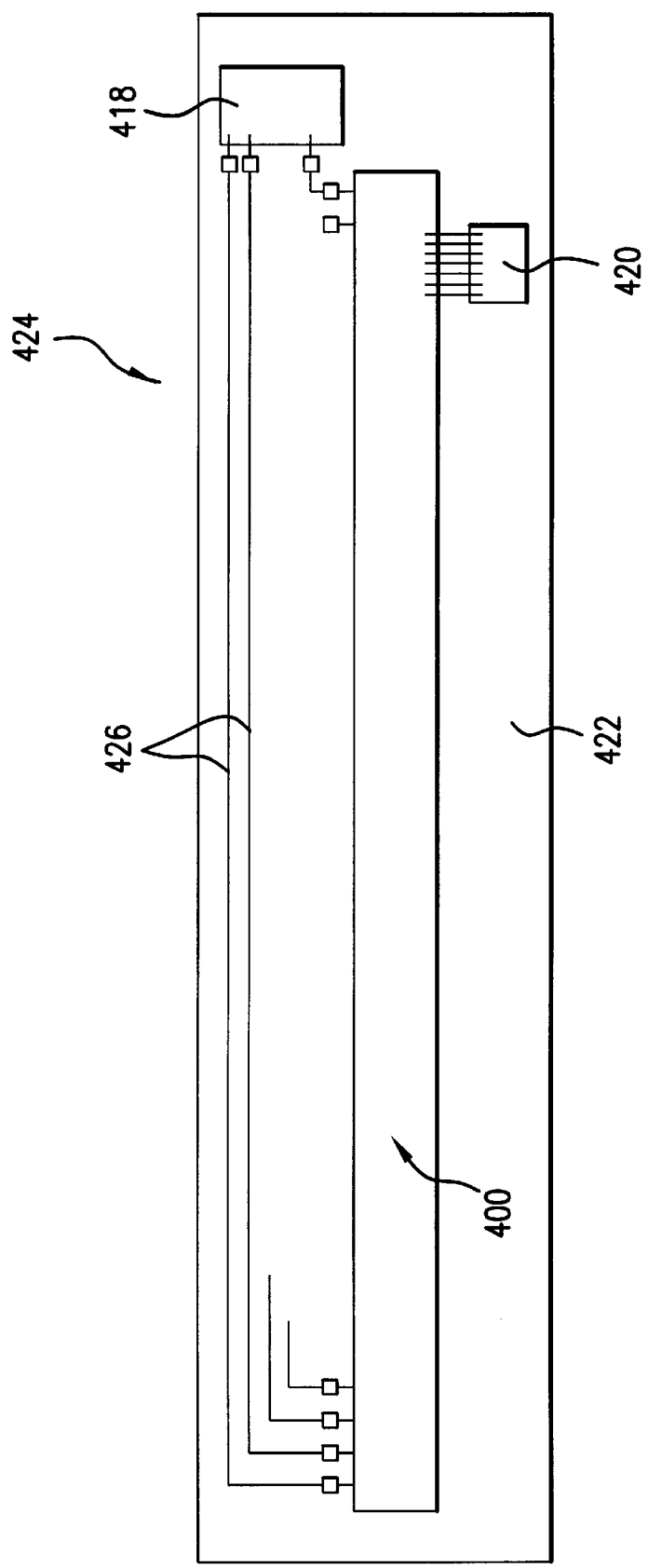
FIG. 26 is a plan view showing an image sensor module employing the image sensor of FIG. 25.
Figure 27:
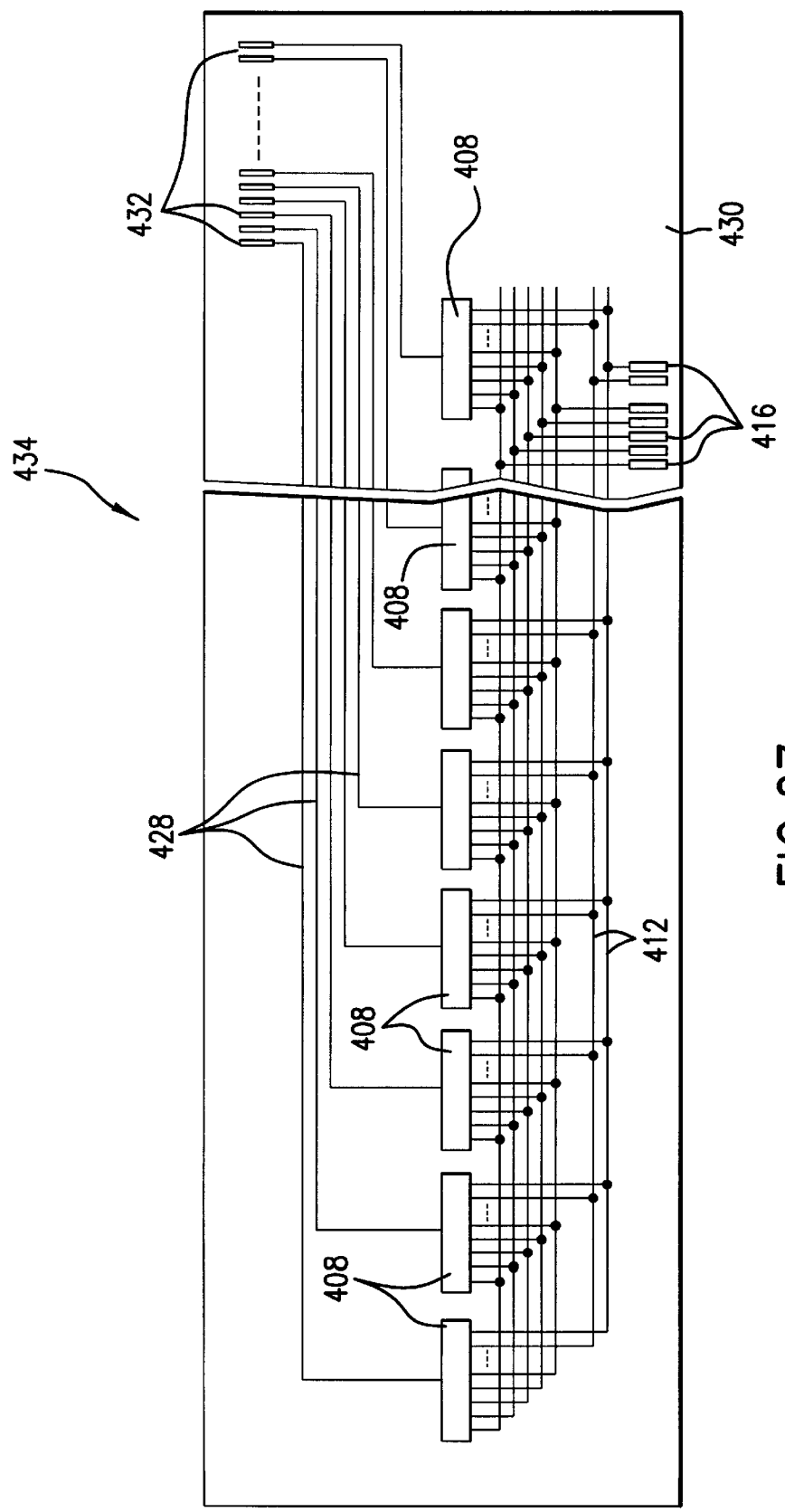
FIG. 27 is a fragmentary arrangement view showing another image sensor currently in use.

Furthermore, as shown in FIG. 18, a dummy wiring 358 may be provided as surrounding the whole of the blocks 318, drive wirings 320 and read-out wirings 322. In this case, too, the noise is reduced in the same way. This loop so dummy wiring 358 may be regarded as the equivalent of dummy wiring near both the drive wiring 320 and read-out wiring 322 which have been interconnected.

Though not shown, the drive conductors may be extended in a sectoral shape from the collectively disposed drive terminals to respective blocks and any other layout can also be optionally adopted.

On the other hand, though not shown, it may be so arranged that the photodiode and blocking diode are connected through the respective anodes, that the cathodes of the blocking diodes in each block are connected in common by a drive wiring and that the cathodes of photodiodes in the same relative positions in respective blocks are interconnected by read-out wiring.

In addition, TFT may be used in lieu of the blocking diode and the photoelectric energy converting element may be a photoconductive CdS-CdSe. Moreover, the present invention can be applied not only to the usual contact type image sensors but also completely contact type image sensors.

What is claimed is:

1. An image sensor comprising:
   an insulating substrate board;
   an array of a plurality of blocks on said substrate board, said blocks of said array each including a plurality of photodiodes, a corresponding number of blocking diodes connected respectively in series and opposite polarity to said photodiodes;
   a common electrode for said number of said blocking diodes for each of said blocks;
   a matrix wiring interconnecting ones of the photodiodes in the same relative positions within respective ones of said blocks;
   a transparent interlayer insulating film covering said photodiodes and said blocking diodes formed on said insulating substrate board;
   said transparent interlayer insulating film having a contact hole and a coupling electrode passing through said contact hole connecting each of said photodiodes to the corresponding one of said blocking diodes in series and opposite polarity; and
   said insulating substrate board being a glass substrate having a thickness of 0.3 to 0.7 mm and a width in the subordinate scanning direction of 1.0 to 2.0 mm, and a ratio of a length in the main scanning direction to the width in the subordinate scanning direction of said glass substrate being not less than about 50 and a ratio of the thickness of said glass substrate to the width in the subordinate scanning direction being not more than 0.7.

2. An image sensor according to claim 1 further comprising a read-out signal correcting block disposed at an initial end of a time series of the array blocks, said read-out signal correcting block being structurally identical to said blocks and connected in light-receiving condition to said matrix wiring to provide a read-out signal.

3. An image sensor according to claim 1 wherein said plurality of blocks is arranged in a time series having an initial and terminal end and includes at lest one of said blocks being a dark output correcting block disposed at one of the initial end and the terminal end of said time series, said dark output correcting block being structurally identical to said blocks forming said array and connected to said matrix wiring in a condition with corresponding ones of said photodiodes of said dark output correcting block shielded from light to provide a dark output readout signal.

4. An image sensor according to claim 1 wherein the photodiodes and the blocking diodes each respectively have a photodiode semiconductor area and a blocking diode semiconductor area, and the ratio of the photodiode semiconductor area to the corresponding blocking diode semiconductor area is 1:0.03 through 0.3

5. An image sensor according to claim 1 wherein the photodiodes have semiconductor parts, said semiconductor parts being of a PIN amorphous silicon semiconductor which contains carbon C in a P-type semiconductor layer.

6. An image sensor according to claim 1 wherein each of said photodiodes and the corresponding blocking diode have an N-type semiconductor layer side and are connected to each other in series and opposite polarity on the N-type semiconductor layer sides thereof.

7. An image sensor according to claim 1 wherein the blocking diodes and photodiodes each have a transparent electrode, said coupling electrode connects the transparent electrodes of corresponding ones of said photodiodes and said blocking diodes, and said coupling electrode covers the transparent electrode of the corresponding blocking diode.

8. An image sensor according to claim 1 wherein said photodiodes each have an electrode conductor leading out to said matrix wiring and connected to said matrix wiring via a contact hole formed in the respective transparent interlayer insulating film to form matrix connections with the matrix wiring, the line-width of the matrix wiring being broader at said connection than the line-width of the remainder of the matrix wiring.

9. An image sensor according to claim 1 wherein electrode conductors are provided leading out from the electrodes of said blocking diodes, the region of the image sensor other than said electrode conductors leading out from electrodes of said blocking diodes and at least output electrodes of said matrix wiring, which form external connections, being covered with a protective film of at least one inorganic insulating material.

10. An image sensor according to claim 1 where electrodes of said photodiodes and blocking diodes on said insulating board are made of a non-diffusing metal and each of the coupling electrodes connecting said photodiodes to said corresponding blocking diodes in series and opposite polarity is a multilayer structure consisting of at least 2 layers formed from a non-diffusing metal material and a good electrode conductor.

11. An image sensor according to claim 1 wherein the number of blocks constituting said image sensor is either 54 or 108 and the number of photodiodes and corresponding clocking diodes constituting each block is either 32 or 16 each.

12. An image sensor according to claim 1 wherein said thickness of said glass substrate is in the range of 0.4 to 0.7 mm.

13. An image sensor according to claim 12 wherein the length in the main scanning direction is in the range of 200 to 340 mm, and the thickness is in the range of 0.5 to 0.7 mm.

14. An image sensor according to claim 12 wherein the ratio of the width in the subordinate scanning direction to the thickness of said glass substrate board is not less than about 1.8.

15. An image sensor according to claim 1 wherein said insulating board is an alkali-free glass substrate board having a surface roughness of not more than 500 Angstrom units on the side where said photodiodes are formed and a curl in the main scanning direction of not more than 0.4 mm per 100 mm length.

16. An image sensor according to claim 15 wherein the surface roughness of said glass substrate board is not more than 200 Angstrom units and the curl in the main scanning direction is not more than 0.2 mm per 100 mm length.

17. A contact type image sensor for direct wire bonded connections to driving ICs, each having a predetermined number of drive outputs, and a reading IC having a predetermined number of read inputs, comprising:

a substrate having an array of blocks and a first side edge;

said blocks each containing a plurality of pairs of photodiodes and blocking diodes;

drive wirings, each connecting in common, in each of said blocks, said blocking diodes of said blocks;

read-out wires, each connecting in common photodiodes of said plurality of photodiodes that occupy the same relative positions in said blocks;

said drive wirings having terminating drive terminals arranged in groups wherein each group has a number of drive terminals equal to the predetermined number of drive outputs;

said groups each having said drive terminals positioned along said first sides edge substantially in correspondence with a positioning of said drive outputs permitting a direct wire bond connection between said drive terminals and said outputs; and said read-out wires terminating in read-out terminals arranged consecutively positioned in a group along said first side edge permitting direct wire bond connections to said read inputs.

18. An image sensor according to claim 15 wherein a dummy wiring is disposed near at least either one of said drive wirings and said read-out wirings.

19. An image sensor according to claim 17 wherein said read-out wires form a matrix wiring including:

an electrode conductor extending from each of said photodiodes;

matrix interconnecting wiring connecting said electrode conductors to connect in common said photodiodes occupying said same relative positions in said blocks; and a line-width of the matrix interconnecting wiring being broader at connections with electrode conductors than a line-width of remainders of the matrix interconnecting wiring.

* * * * *